United States Patent [19]

Bourgeois et al.

[11] 4,334,307
[45] Jun. 8, 1982

[54] DATA PROCESSING SYSTEM WITH SELF TESTING AND CONFIGURATION MAPPING CAPABILITY

[75] Inventors: David R. Bourgeois, Framingham; James A. Ryan, West Boylston; Subhash C. Varshney, W. Roxbury, all of Mass.

[73] Assignee: Honeywell Information Systems Inc., Waltham, Mass.

[21] Appl. No.: 108,047

[22] Filed: Dec. 28, 1979

[51] Int. Cl.³ .............................................. G06F 11/00
[52] U.S. Cl. .................................. 371/16; 324/73 R; 364/200; 371/21
[58] Field of Search .................... 371/16, 18, 21, 27; 324/73 R, 73 AT; 364/200, 900

[56] References Cited

U.S. PATENT DOCUMENTS

| | | | |
|---|---|---|---|
| 3,611,293 | 10/1971 | Constable et al. | 340/149 A |
| 3,778,595 | 12/1973 | Hatanaka et al. | 235/61.7 B |
| 3,831,148 | 8/1974 | Greenwald et al. | 371/21 |
| 3,982,103 | 9/1976 | Goldman | 239/61.7 B |
| 4,034,194 | 7/1977 | Thomas et al. | 371/18 |
| 4,075,460 | 2/1978 | Gorgens | 235/420 |
| 4,134,537 | 1/1979 | Glaser et al. | 235/379 |
| 4,191,996 | 3/1980 | Chesley | 364/200 |
| 4,227,244 | 10/1980 | Thorsrud et al. | 371/21 |

OTHER PUBLICATIONS

Gordon and Nadig, Hexadecimal signatures identify troublespots in microprocessor systems, Electronics, Mar. 3, 1977, pp. 89–96.

R. C. Goldblatt, How Computers Can Test Their Own Memories, Computer Design, vol. 15, No. 7, Jul. 1976, pp. 69–73.

H. J. Nadig, Signature Analysis-Concepts, Examples, and Guidelines, Hewlett Packard Journal, May 1977, pp. 15–21.

Primary Examiner—Charles E. Atkinson
Attorney, Agent, or Firm—Nicholas Prasinos

[57] ABSTRACT

A data processing system employing firmware for executing a self test routine each time the system goes through the power-up cycle. The self test firmware provides for compilation of a system configuration map during each execution so that configuration and status data is made available for accessing by the system operation firmware and application software. This enables external systems to set appropriate interrupt vectors and levels and to arrange their physical I/O and device handlers so that various devices within the local system can be accessed. The routines performed in the self test operation include a CPU test, a RAM test, a real time clock test, a communication controller loop-back test, a ROM signature calculation, a controller I/O test, a system configuration map compilation, and a status display routine.

17 Claims, 39 Drawing Figures

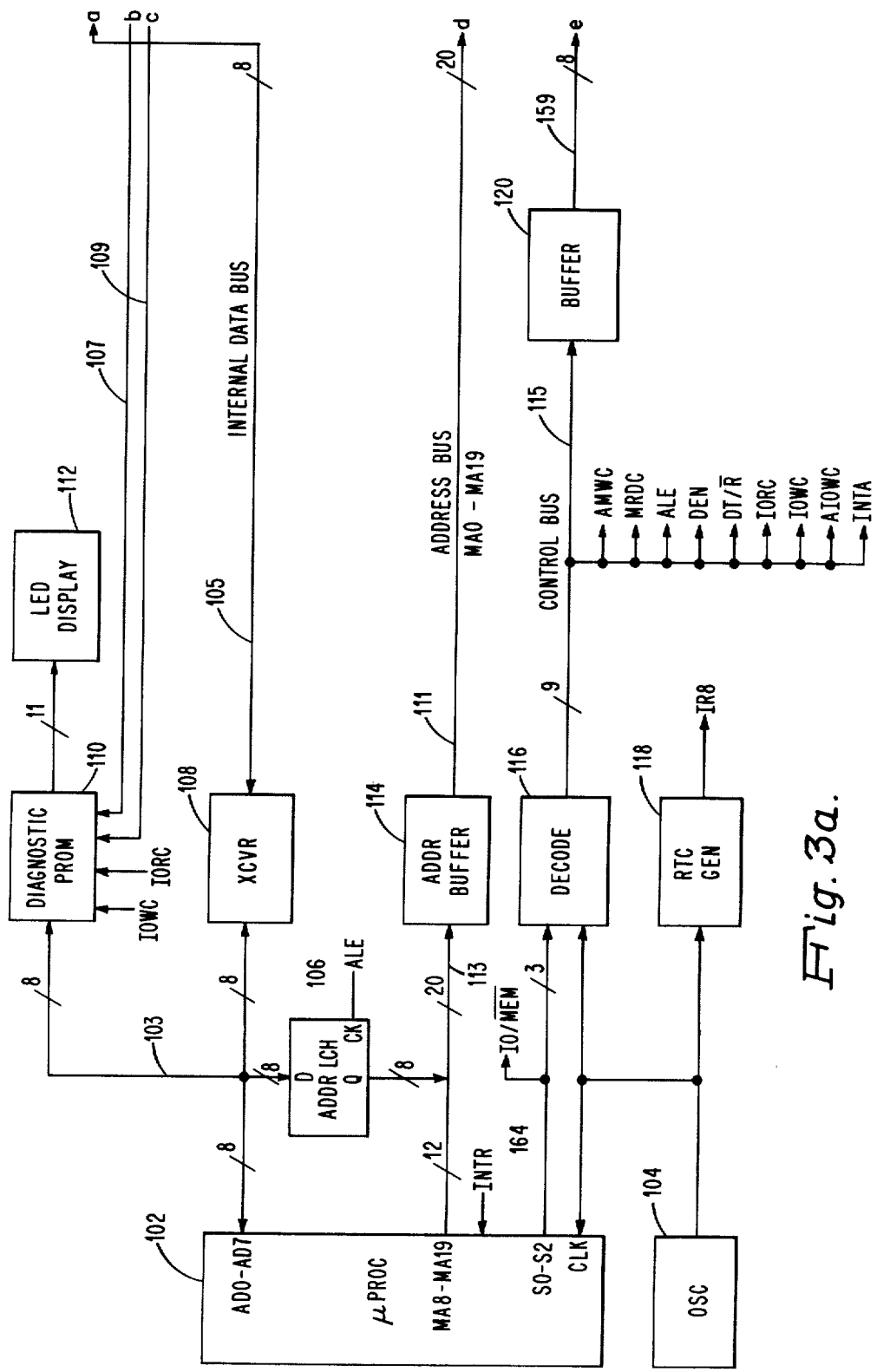

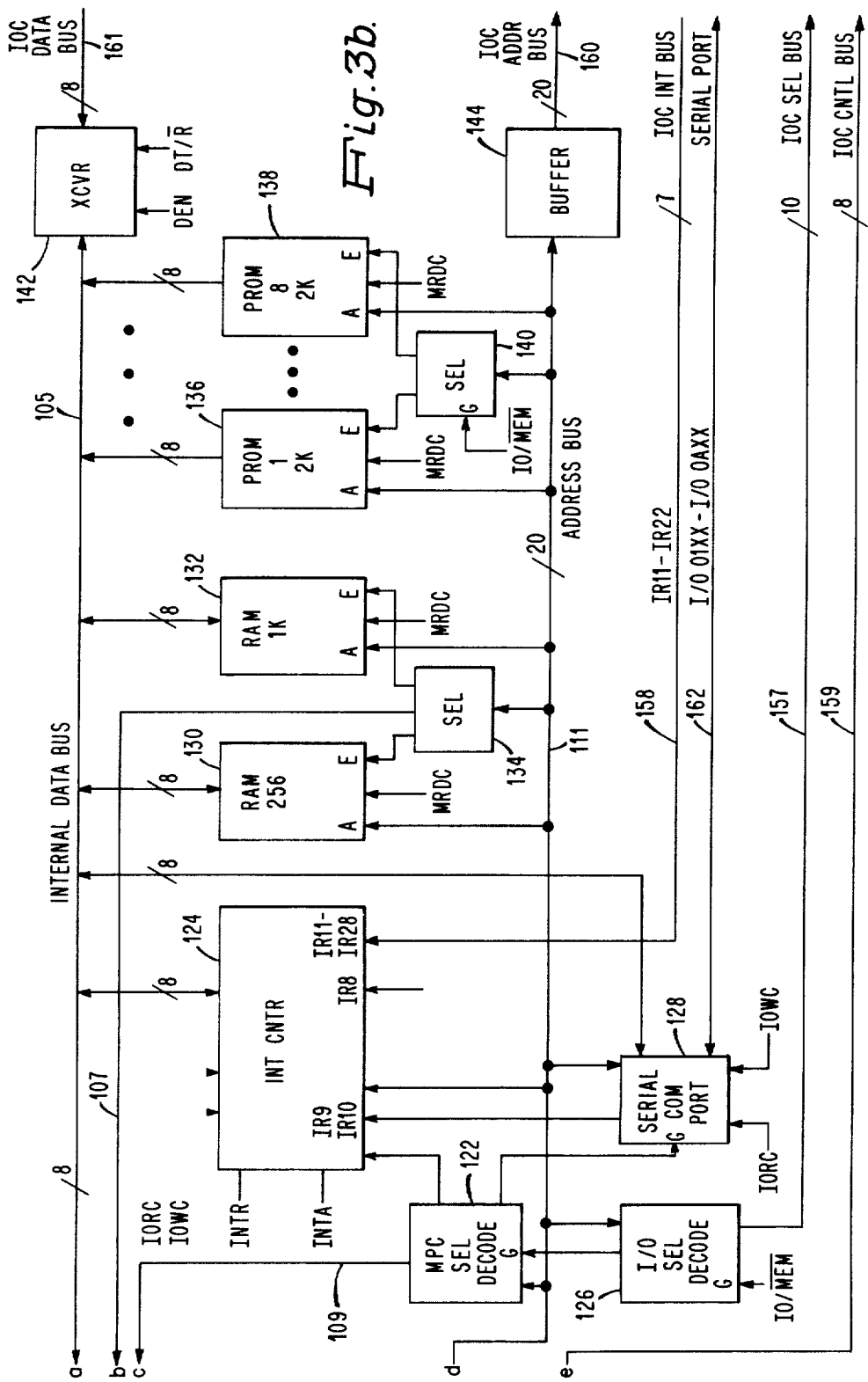

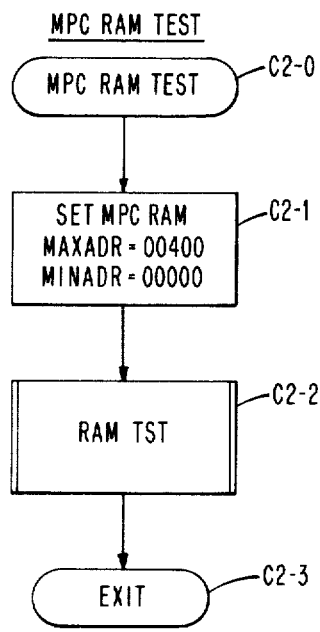
Fig. 7.
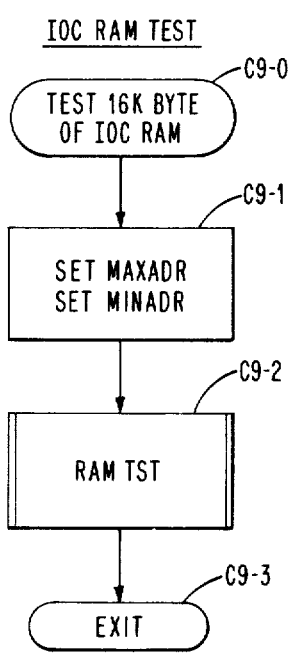
Fig. 8.
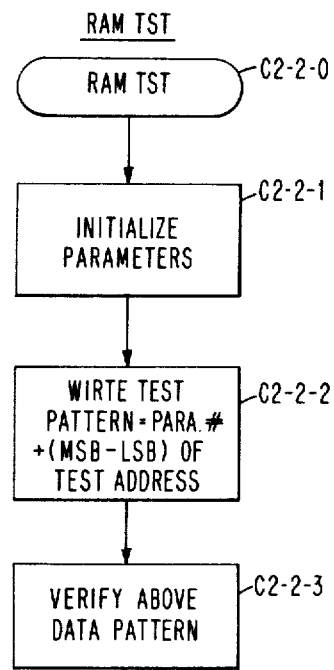
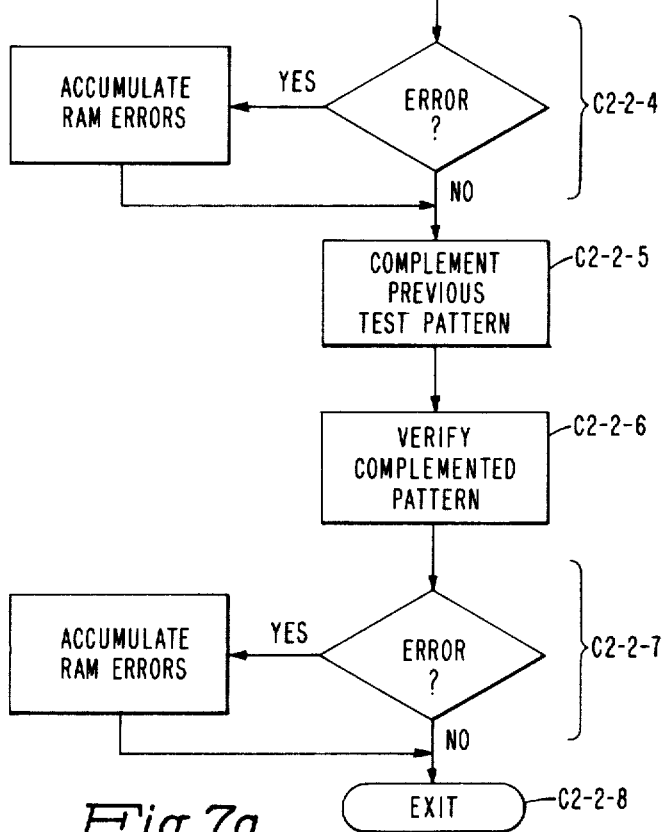
Fig. 7a.

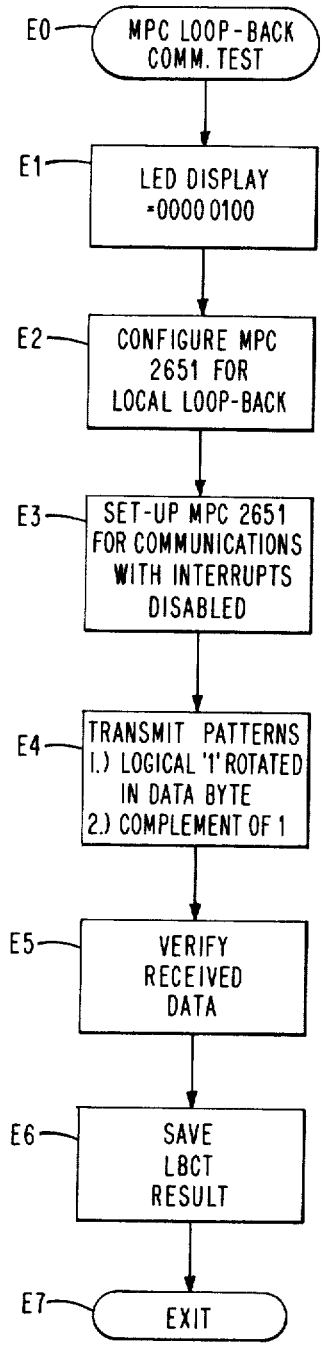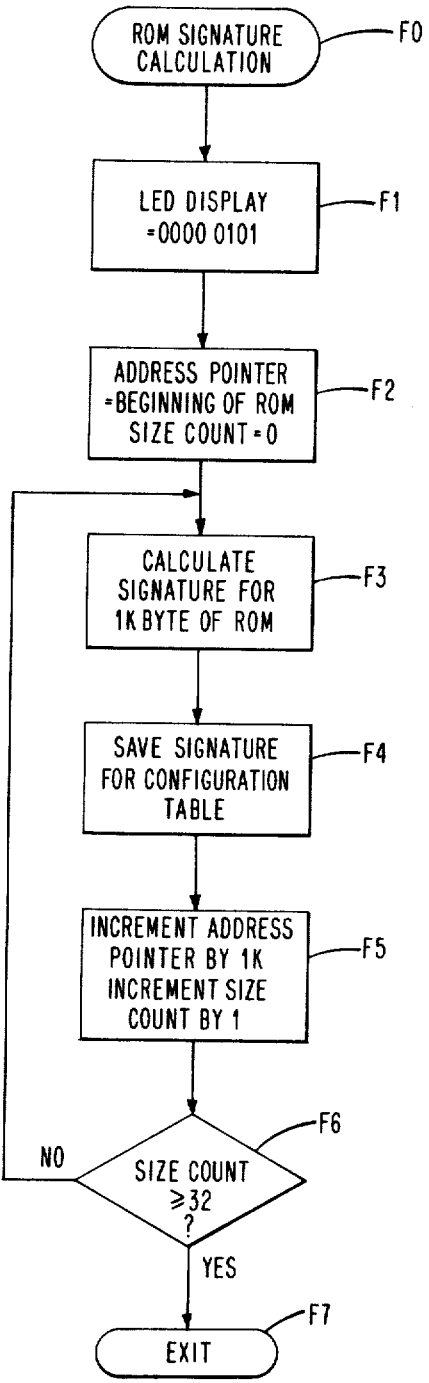
Fig. 10.
Fig. 11.

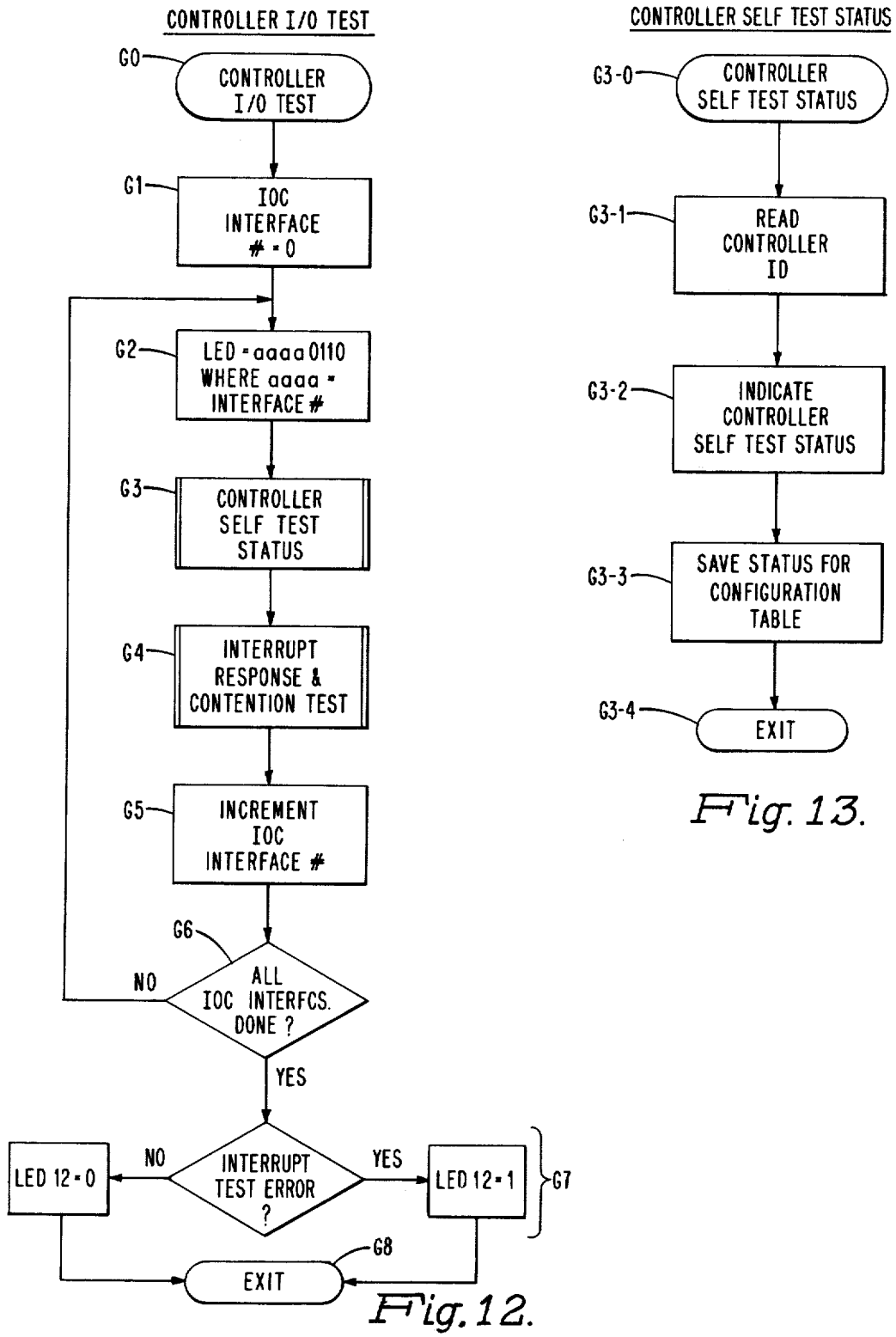

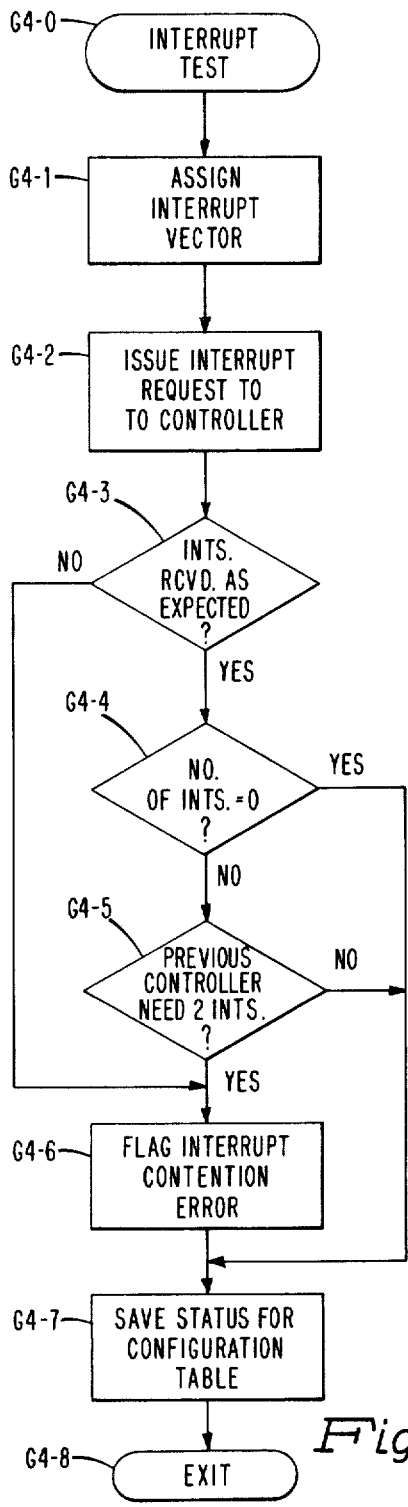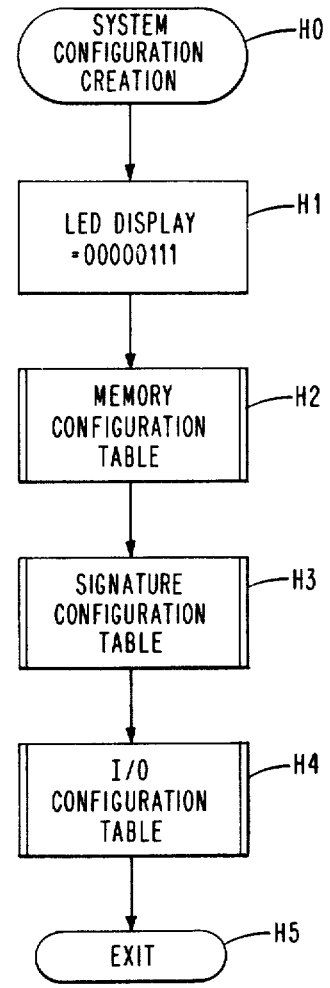
Fig. 14.
Fig. 15.

(C) COPYWRIGHT INCOTERM CORP (1979)
ALL RIGHTS RESERVED

```
            DEFINE SEGMENTS
            ---------------
DATASG      SEGMENT AT 0               ;DEFINE DATA SEGMENT
DATASG      ENDS                       ;DEFINE PTR TO CODE SEGMENT
CODEGP      GROUP    CODESG
            ASSUME CS:CODEGP,DS:DATASG,SS:DATASG,ES:DATASG

DEFINE PROGRAM VARIABLES
            ------------------------
PARA0       EQU      0                 ;BEGINNING OF PARA 0
PARAF       EQU      0F000H            ;BEGINNING OF PARA F

SELF TEST LED DISPLAY PATTERN
            ---------- ------- -------
            NOTE:  FOR DISPLAY A LOGICAL '1' EXTINGUISHES THE LED
                               A LOGICAL '0' LIGHTS THE LED

: WHEREAS A LOGICAL '1' HERE CORRESPONDS TO LIT LED

LEDCPU      EQU      01                ;8088 CPU TEST
LEDRAM      EQU      02                ;RAM TEST
LEDRTC      EQU      03                ;REAL TIME CLOCK TEST
LEDCOMM     EQU      04                ;MPC LOOP-BACK COMM. TEST
LEDSIG      EQU      05                ;ROM SIGNATURE CALCULATIONS
LEDIO       EQU      06                ;CONTROLLER I/O TEST
LEDCNFG     EQU      07                ;SYSTEM CONFIGURATION CREATION
LEDINIT     EQU      08                ;FIRMWARE INITIALIZATION IN PROGRESS

SELF TEST CONTROL AREA
            ----------------------
STCA        EQU      X'0380'           ;BOTTOM OF STCA
SELFSTS     EQU      STCA              ;SELF TEST STATUS BYTE
RAMSTS      EQU      SELFSTS+1         ;IOC RAM TEST STATUS BYTE
LPBKSTS     EQU      RAMSTS+1          ;MPC COMM LOOPBACK STATUS BYTE
IOSTS       EQU      LPBKSTS+1         ;I/O TEST STATUS BYTE
CSLFSTS     EQU      IOSTS+1           ;CONTROLLER SELF TEST STS BYTE
IRSTS       EQU      CSLFSTS+1         ;INTERRUPT RESPONSE STS BYTE
MEMPTR      EQU      IRSTS+1           ;PTR TO MEMORY CNFG TABLE
MEMSZ       EQU      MEMPTR+4          ;SIZE OF MEM CNFG TABLE
SIGPTR      EQU      MEMSZ+2           ;PTR TO SIG CNFG TABLE
SIGSZ       EQU      SIGPTR+4          ;SIZE OF SIG CNFG TABLE
IOPTR       EQU      SIGSZ+2           ;PTR TO IO CNFG TABLE
IOSZ        EQU      IOPTR+4           ;SIZE OF IO CNFG TABLE
SLOT@       EQU      IOSZ+2            ;IOC INTERFACE SLOT #
PARA@       EQU      SLOT@+1           ;PARAGRAPH #
BLOCK@      EQU      PARA@+1           ;16K BLOCK # WITHIN A PARA
CNFGBLK     EQU      BLOCK@+1          ;FLAG FOR TEST OF CNFG BLOCKS
OFF16       EQU      CNFGBLK+1         ;OFFSET ADR PTR TO 16K BLOCK
GOOD16      EQU      OFF16+1           ;FLAG FOR A GOOD 16K BLOCK
IOSLOT      EQU      GOOD16+1          ;SLOT # THAT FAILS IO TEST
INTRCV      EQU      IOSLOT+1          ;INTERRUPT RECV INDICATOR
INTSPUR     EQU      INTRCV+1          ;SPURIOUS INTERRUPT INDICATOR
INTPRV      EQU      INTSPUR+1         ;# OF IL'S REQUIRED BY PREVIOUS SLOT
LEDPTRN     EQU      INTPRV+1          ;LED PATTERN AT THE END OF SELF TEST
STCAEND     EQU      LEDPTRN+1         ;END OF SELF TEST CONTROL AREA
```

*Fig. 16.*

```
              MPC RAM LOCATIONS
              -----------------
MPCRAMT   EQU      X'03FF'           ;TOP OF MPC RAM
MPCRAMB   EQU      X'0000'           ;BOTTOM OF MPC RAM
MPCRAMS   EQU      X'0400'           ;SIZE OF MPC RAM
STACKH    EQU      X'017F'           ;TOP OF STACK AREA
SIGTBL    EQU      X'0180'           ;BOTTOM OF SIGNATURE TABLE
IOTBL     EQU      SIGTBL+192        ;BOTTOM OF IO CNFG TABLE
MEMTBL    EQU      IOTBL+64          ;BOTTOM OF MEMORY CNFG TABLE

SIGNATURE WORK AREA
              -------------------
SIG       EQU      STCAEND           ;8 BYTE BUFFER FOR SIGC ROUTINE
SIGR2     EQU      SIG+8             ;2 BYTE BUFFER FOR SIGC ROUTINE
SIGR3     EQU      SIGR2+2           ;2 BYTE BUFFER FOR SIGC ROUTINE
ROMADR    EQU      SIGR3+2           ;ROM ADDRESS
SIGBUF    EQU      ROMADR+2          ;SAVE PTR TO SIG CNFG TABLE HERE
ROMSIZE   EQU      1024              ;ROM SIZE (=1K)

CONTROLLER ID DEFINITIONS
              -------------------------
KBDID     EQU      1                 ;KEYBOARD ID
MCRID     EQU      2                 ;MAG CARD READER ID
PRTID     EQU      3                 ;PRINTER ID
CRTID     EQU      4                 ;CRT ID
COMID     EQU      5                 ;COMM CONTROLLER ID
MPCID     EQU      6                 ;MICRO-PROCESSOR CONTROLLER
MEMID     EQU      7                 ;MEMORY BOARD ID

MPC I/O PORT DEFINITIONS
              ------------------------
SWTCH     EQU      1                 ;SWITCH BUFFERPORT
LEDPORTA  EQU      X'20'             ;PORT A OF DIAG PROM
LEDPORTB  EQU      X'21'             ;PORT B OF DIAG PROM
TIACKPT   EQU      X'61'             ;SEND TEST INT ACK TO ALL IOC'S
TESTCMPT  EQU      X'62'             ;SEND ENABLE INT TEST TO ALL IOC'S
ENBRTC    EQU      0                 ;ENABLE RTC
DSBRTC    EQU      0                 ;DISABLE RTC
CLRRTC    EQU      0                 ;CLEAR RTC INTR

MPC 2651 COMMUNICATIONS PORT DEFINITIONS
              ----------------------------------------
COMM0     EQU      X'30'             ;READ RECV HOLDING REG
COMM1     EQU      X'31'             ;READ STATUS REG
COMM2     EQU      X'32'             ;READ MODE REG 1/2
COMM3     EQU      X'33'             ;READ COMMAND REG
COMM4     EQU      X'34'             ;WRITE X-MIT HOLDING REG
COMM5     EQU      X'35'             ;WRITE SYN1 (SYN2)/OLE REG
COMM6     EQU      X'36'             ;WRITE MODE REG 1/2
COMM7     EQU      X'37'             ;WRITE COMMAND REG

SUB-PORT DEFINITIONS
              --------------------
IDPORT    EQU      0                 ;PORT # FOR ID READ
CNFGPRT1  EQU      1                 ;PORT # TO READ CONFIGURATION
CNFGPRT2  EQU      2
INTTST    EQU      3                 ;PORT # TO SEND INTERRUPT REQUEST
BASEPORT  EQU      4                 ;PORT # FOR BASE ADR

EXTERNALLY DEFINED LABELS
              -------------------------
DIAGMON   EQU      0                 ;PTR TO DIAGNOSTIC MONITOR
FIRMWARE  EQU      0                 ;PTR TO FIRMWARE ENTRY
```

*Fig. 17.*

```
                OTHER SYMBOLS
                -------------
RTCIL           EQU      8                ;RTC INTERRUPT LEVEL

POWER-UP/RESTART BEGINS HERE
                ----------------------------
CODESG          SEGMENT AT 0F000H         ;BEGINNING OF CODE SEGMENT
                ORG      0FFF0H
                JMP      FAR PTR SELFTST
                ----------------------
                SELF TEST CONTROL LOOP
                SELF TEST BEGINS HERE
                ----------------------                               INITIALIZATION
                ORG      0F000H
PROGNM          DB       '7712 SELF TEST'
SELFTST:        NOP
                MOV      AX,PARA0
                MOV      DS,AX            ;ASSIGN DATA SEGMENT
                MOV      SS,AX            ;ASSIGN STACK SEGMENT
                MOV      SP,STACKH        ;SET STACK PTR TO TOP OF STACK

TEST 8088 CPU          ─── ONE INSTRUCTION
SELFLP1:        MOV      AL,LEDCPU        ;GET LED PATTERN FOR CPU TEST    ⎫
                NOT      AL               ;COMPLEMENT TO LIGHT LED'S        ⎬ A
                OUT      LEDPORTA,AL      ;LIGHT UP PATTERN ON LED'S       ⎭
                JMP      CPUTST           ;TEST 8088 CPU                    B
CPUHLT:         HLT                       ;CPU ERROR IF COME HERE

TEST RANDOM ACCESS MEMORY

SELFLP2:        JMP      MEMTST                                             C

TEST REAL TIME CLOCK

SELFLP3:        CALL     RTCTST                                             D

ON-BOARD LOOPBACK TEST FOR MPC 2651 COMM CONTR

SELFLP4:        CALL     LPBKTST                                            E

CALCULATE ROM SIGNATURES

SELFLP5:        CALL     SIGNTRE                                            F

TEST CONTROLLER I/O INTERFACE

CALL     IOTST                                              G

CREATE SYSTEM CONFIGURATION

CALL     SYSCNFG                                            H

SET LED PATTERN FOR SELF TEST STATUS

CALL     TSTSTS                                             I
```

Fig. 18.

```
                    EXIT FROM SELF TEST
                    -------------------
            IN      AL,SWTCH        ;READ SWITCH BUFFER STS          ⎫K
            SAL     AL,1            ;CF = EXIT MODE, 0 = FIRMWARE MODE
            JAE     DIAGMON         ;CF = 1 -> DIAGNOSTIC MODE        ⎫L
            MOV     AL,M[LEDPTRN]   ;AL = COPY OF LED DISPLAY         ⎫
            OR      AL,8            ;ADD BIT TO TURN-ON FIRMWARE LED  ⎬M
            NOT     AL                                                ⎭
            OUT     LEDPORTA,AL     ;DISPLAY PATTERN ON LED'S
            JMP     FIRMWARE        ;EXIT TO FIRMWARE                  N

-----------------------------
                    END OF SELF TEST CONTROL LOOP
                    -----------------------------

--------------
                    8088 CPU TEST
                    --------------
CPUERR:     JMP     CPUHLT          ;DEFINE PTR TO CPUHLT
CPUTST      EQU     $                                                 80

BUS INTERFACE UNIT TEST
                    -BY SELECTIVE OPCODE AND OPERAND FETCH

CPUT1:      MOV     DX,055AAH       ;DH = 55, DL = AA                 81
            MOV     AL,0AAH         ;AL = AA
            CMP     AL,DL           ;BOTH AL & DL MUST HAVE AA
            JNZ     CPUERR          ;OTHERWISE CPU ERROR
            JZ      SHORT CPUT1A    ;DO THIS JUST IN CASE JNZ DOESN'T WORK
            JMP     CPUERR          ;IF COME HERE THEN CPU PROBLEM
CPUT1A:     MOV     CH,055H         ;CH = 55
            CMP     CH,DH           ;CH = DH?
            JNZ     CPUERR
            CMP     DX,55AAH        ;COMPARE WITH IMMEDIATE DATA FETCH
            JNZ     CPUERR          ;IF NOT EQUAL THEN CPU ERROR

EXECUTION UNIT TEST

TEST DATA TRANSFER

CPUT2       EQU     $                                                 82

TEST INDIRECT DATA X-FER THRU BX

USES DATA (= X'55AA') DEFINED A BYTE AFTER CPUT1

LDS     CPUT1           ;SET SEGMENT & OFFSET ADDRESS
            MOV     AL,M[BX+1]      ;READ BYTE USING INDIRECT WITH DISP. ADDR
            INX     BX              ;OFFSET POINTS TO DATA BYTE
            MOV     DX,M[BX]        ;READ WORD THRU INDIRECT ADDR
            MOV     SI,1            ;SET INDEX REG TO 1
            CMP     DX,55AAH        ;DX MUST BE 55AA
            JNZ     CPUERR          ;OTHERWISE DATA X-FER ERROR
            MOV     AH,M[BX+SI]     ;READ BYTE USING INDEXED INDIRECT ADDR
            CMP     AX,DX           ;AX & DX MUST NOW BE EQUAL
            JNZ     CPUERR          ;OTHERWISE DATA X-FER ERROR

TEST EXCHANGE OF DATA BETWEEN REGISTERS

XCHG    CX,AX           ;TEST EXCHANGE OF DATA
            CMP     CX,DX           ;CX ? DX
            JNZ     CPUERR          ;ERROR IF IMPROPER EXCHANGE
            INC     CX              ;MODIFY CX
            XCHG    CX,AX           ;EXCHANGE DATA AGAIN
            CMP     AX,DX           ;AX & DX MUST NOW BE DIFFERENT
            JZ      CPUERR          ;OTHERWISE ERROR
```

*Fig. 19.*

```
                TEST DATA TRANSFER USING SEGMENT OVER-RIDE PREFIX                    B2
                LEA     SI,CPUT1            ;SI = PTR TO CPUT1
                MOV     AX,CS:[SI+1]        ;INDEXED READ USING SEGMENT OVER-RIDE
                CMP     AX,DX               ;AX & DX MUST HAVE SAME DATA
                JNZ     CPUERR              ;OTHERWISE CPU ERROR

TEST CONTROL TRANSFER

CPUT3   EQU     $
                CALL    CPUT3A              ;TEST CALL CONTROL TRANSFER           B3
                JMP     CPUERR              ;ERROR IF COME HERE

TEST CONDITIONAL CONTROL TRANSFER

CPUT3A: XOR     AL,AL               ;AL=0, SF=OF=0, ZF=PF=1
                JZ      CPUT3B              ;TEST JUMP ON ZERO
                JMP     CPUERR              ;ERROR IF COME HERE
        CPUT3B: JP      CPUT3C              ;TEST JUMP ON PARITY EVEN
                JMP     CPUERR
        CPUT3C: JNO     CPUT3D              ;TEST JUMP ON NOT-OVERFLOW
                JMP     CPUERR
        CPUT3D: JNS     CPUT3E              ;TEST JUMP ON NOT-SIGN
                JMP     CPUERR
        CPUT3E: SUB     AL, 1               ;AL=FF, ZF=0, SF=OF=CF=AF=PF=1
                JZ      CPUERR              ;ERROR IF ZF IS SET
                JNS     CPUERR              ;ERROR IF SF=0
                JNO     CPUERR              ;ERROR IF OF=0
                JNP     CPUERR              ;ERROR IF PARITY ODD
                JNZ     CPUT3F              ;TEST JUMP ON NOT ZERO
                JMP     CPUERR              ;ERROR IF COME HERE
        CPUT3F: JS      CPUT3G              ;TEST JUMP ON SIGN
                JMP     CPUERR              ;ERROR IF COME HERE
        CPUT3G: JNAE    CPUT3H              ;TEST JUMP ON CF=1
                JMP     CPUERR
        CPUT3H: CLC                         ;CF=0
                JAE     CPUT3I              ;TEST JUMP ON CF=0
                JMP     CPUERR              ;ERROR IF COME HERE

TEST ITERATION CONTROL TRANSFER

CPUT3I: MOV     CX,0                ;SET COUNT REG CX=0
                JCXZ    CPUT3K              ;TEST JUMP ON CX ZERO
        CPUT3J: JMP     CPUERR              ;ERROR IF COME HERE
        CPUT3K: XOR     AL,AL               ;AL=0, ZF=1
                LOOPNZ  CPUT3J              ;TEST LOOP ON NOT 0 (THIS SHOULDN'T OCCUR)
                LOOPZ   CPUT3L              ;TEST LOOP ON 0 (THIS JUMP SHOULD OCCUR)
                JMP     CPUERR              ;ERROR IF COME HERE
        CPUT3L: INX     AX                  ;AX=1, ZF=0
                LOOPZ   CPUT3J              ;ERROR IF THIS JUMP IS TAKEN
                LOOPNZ  CPUT3M              ;ERROR IF THIS JUMP IS NOT TAKEN
        CPUER:  JMP     CPUERR
        CPUT3M  EQU     $

TEST ARITHMETIC & LOGIC UNIT

CPUT4   EQU     $                                                             B4
                MOV     AX,0102H            ;AX=0102H
                MOV     BX,0408H            ;BX=0408H
                MOV     DX,1020H            ;DX=1020H
                MOV     CX,100H             ;CX=0100H
```

*Fig. 20.*

```
                PERFORM SOME ALU BYTE OPERATIONS 256 TIMES
                THUS REG'S AX, BX, AND DX SHOULD REMAIN UNCHANGED

CPUT4A:  INC    BL              ;BL=BL+1    TEST INCREMENT         84
         DEC    BH              ;BH=BH-1    TEST DECREMENT
         ROR    AL,1            ;TEST ROTATE RIGHT
         RCL    AH,1            ;TEST ROTATE LEFT THRU CARRY
         RCL    AH,1            ;TEST ROTATE LEFT THRU CARRY
         NOT    DL              ;DL=-DL     TEST NOT OPERATION
         ADD    DH,DL           ;DH=DH+DL   TEST ADDITION
         LOOP   CPUT4A          ;REPEAT 256 TIMES

CMP    AX,0102H        ;AX=102H?
         JNZ    CPUER           ;ALU ERROR IF NOT EQUAL
         OR     CL,CH           ;CL & CH MUST BE ZERO
         JNZ    CPUER           ;OTHERWISE ERROR
         TEST   DL,20H          ;IS DL = 20?
         JNZ    CPUER           ;ERROR OTHERWISE
         XOR    DH,DL           ;DH=30H
         TEST   DH,30H          ;IS DH = 30H?
         JNZ    CPUER           ;ERROR OTHERWISE

PERFORM SOME ALU WORD OPERATIONS 256 TIMES

MOV    CX,100H         ;SET LOOP COUNT TO 256H
CPUT4B:  INC    BX              ;TEST WORD INCREMENT
         DEC    AX
         INC    AX              ;THUS AX IS UNCHANGED
         ROR    DX,1            ;ROTATE RIGHT CLOSED
         SAL    DX,1            ;THUS DX IS UNCHANGED
         OR     DX,AX           ;DX=1122H, AX-0102H
         XOR    DX,AX           ;DX=1020H, AX=0102H

TEST   BX,0408H        ;IS BX = 0408?
         JNZ    CPUERR          ;ERROR IF NOT
         CMP    DX,1020H        ;DX MUST BE 0
         JNZ    CPUER           ;OTHERWISE CPU ERROR
         AND    AX,DX           ;AX MUST NOW BE 0
         JNZ    CPUER           ;OTHERWISE ERROR

TEST STRING MANIPULATION

CPUT5    EQU    $

SCAN A STRING                                              85

ASSUME ES:CODESG       ;THIS IS FOR ASSEMBLER
         MOV    AX,CS           ;AX = CODE SEG REG
         MOV    ES,AX           ;SET EXTRA SEG EQUAL TO CODE SEG
         MOV    DI,PROGNM       ;DI = PTR TO STRING

SCAN STRING FORWARD FOR A BYTE MATCH

CLD                    ;CLEAR DF TO SCAN FORWARD
         MOV    AL,'S'          ;AL = 'S'
         MOV    CX,14           ;CX = LENGTH OF STRING
         REP                    ;REPEAT NEXT STRING OPERATION
         SCAS                   ;SCAN UNTIL 'S' OR CX ZERO
         CMP    AL,8            ;CL MUST BE 8
         JNE    CPUER           ;OTHERWISE STRING MANIPULATION ERROR
```

*Fig. 21.*

```
                    SCAN BACKWARDS FOR A WORD MATCH

STD                         ;SET BACKWARD DIRECTION              B5
                    MOV     DI,SELFTST-1        ;DI = PTR TO END OF STRING
                    MOV     CL,14               ;COUNT = 7 WORDS
                    MOV     AX,'12'             ;AX = WORD TO BE SCANNED
                    REP     SCAS                ;REPEAT SCAN UNTIL '12' OR CX=0
                    CMP     CL,2                ;COUNT MUST BE 2
                    JNE     CPUER               ;OTHERWISE CPU ERROR

END OF CPU TEST
                    ---------------

JMP     SELFLP2             ;CONTINUE WITH SELF TEST             B6

------------------------
                    TEST RANDOM ACCESS MEMORY
                    ------------------------
                    NO RETURN ON CATASTROPHIC FAILURES                               C0
        MEMTST      EQU     $

TEST RAM RESIDENT ON THE MICROPROCESSOR BOARD

MEMTST1     MOV     AL,LEDRAM           ;GET PATTERN FOR RAM TEST        ⎫
                    NOT     AL                  ;COMPLEMENT TO LIGHT LED         ⎬ C1
                    OUT     LEDPORTA,AL         ;DISPLAY TEST RUNNING            ⎭
                    JMP     MPCRAM              ;TEST MPC RAM                      C2
        MEMTST2     OR      AL,AL               ;IS MPC RAM OK?                  ⎫ C3
                    JNZ     MEMTST1             ;REPEAT IN CASE OF ERRORS        ⎭

NOW MPC RAM CAN BE USED AS SELF TEST CONTROL BLOCK,
                    STACK AND WORK AREA

XOR     AX,AX               ;CLEAR AX                      ⎫
                    MOV     SS,AX               ;ASSIGN STACK SEGMENT           |
                    MOV     DS,AX               ;ASSIGN DATA SEGMENT            ⎬ INITIALIZATION
                    MOV     ES,AX               ;ASSIGN EXTRA SEGMENT           |
                    MOV     SP,STACKH           ;SET STACK PTR                 ⎭

PREPARE FOR IOC RAM TEST

MEMTST3     EQU     $                                                        C4
                    MOV     AX,0                ;CLEAR AX
                    MOV     M[GOOD16],AL        ;CLEAR GOOD 16K BLOCK FLAG
                    MOV     M[SLOT@],AL         ;INIT IOC SLOT # TO 0
                    MOV     M[RAMSTS],AL        ;CLEAR TEST STATUS BYTE
                    MOV     M[MEMSZ],AX         ;CLEAR MEMCNFG TABLE SIZE
                    MOV     AX,MEMTBL
                    MOV     M[MEMPTR],AX        ;INIT PTR TO MEM CNFG TABLE
                    MOV     AL,X'10'            ;HIGH NIBBLE OF AL = PARAGRAPH #
                    MOV     M[PARA@],AL         ;INIT FOR NEXT PARA ADR SPACE AVAILABLE

SEARCH FOR A MEMORY CONTROLLER BOARD

MEMTST4     EQU     $
                    MOV     DL,IDPORT           ;DL = PORT # FO ID READ          ⎫
                    MOV     DH,M[SLOT@]         ;DH = SLOT #                     ⎬ C5
                    IN      AL,DX               ;AL = CONTROLLER ID              ⎭
                    AND     AL,X'3F'            ;MASK-OFF UNNECESSARY BITS       ⎫
                    CMP     AL,MEMID            ;IS IT A MEM CONTR?              ⎬ C6
                    JNZ     MEMTST9             ;NO, THEN CONTINUE SEARCH        ⎭
```

*Fig. 22.*

```
                A MEMORY CONTR HAS BEEN DETECTED
                GET ITS CONFIGURATION & UPDATE LED DISPLAY

MEMTST5    EQU     $                                                                    C7
           MOV     DL,CNFGPORT
           IN      AL,DX              ;AL = MEM CONFIG BYTE
           NOT     AL                 ;FOLLOWING IS TO CONVERT ID TO # OF 16K BLOCKS
           AND     AL,X'03'           ;RETAIN ONLY USEFUL BITS
           CMP     AL,X'03'
           JNE     SHORT MEMTST5A
           INC     AL
MEMTST5A   EQU     $
           MOV     M[CNFGBLK],AL      ;SAVE MEMORY CONFIG (# OF 16K BLOCKS)

MOV     AL,M[SLOT@]        ;AL = SLOT #
           MOV     CL,4
           SAL     AL,CL              ;HIGH NIBBLE OF AL = SLOT #
           OR      AL,LEDRAM          ;GET RAM TEST #
           NOT     AL                 ;COMPLEMENT TO LIGHT UP LED'S
           OUT     LEDPORTA,AL        ;UPDATE LED DISPLAY

ASSIGN BASE ADDR TO MEMORY CONTR
                INIT TEST PARAMETERS

MEMTST6    EQU     $                                                                    C8
           MOV     AL,0               ;AL = 0
           MOV     AH,M[PARA@]        ;AX = BASE ADDR AT 64K BOUNDARY
           MOV     DL,BASEPORT
           MOV     DH,M[SLOT@]        ;DX = PORT ADR TO WRITE BASE ADR
           OUT     AX,DX              ;ASSIGN BASE ADDR TO MEM CONTR
           MOV     M[OFF16],0         ;INIT OFFSET ADR FOR 16K BLOCK
           MOV     M[BLOCK@],4        ;INIT TO MAX'M # OF BLOCKS ON A MEM CONTR

TEST 16K BYTE OF IOC RAM

MEMTST7    EQU     $                                                                   }C9
           CALL    IOCRAM             ;TEST 1 BLOCK
           TEST    DL,0               ;IS RAM BLOCK GOOD?                              C10
           JNZ     SHORT MEMTST7A
           MOV     M[GOOD16],1        ;SET FLAG FOR A GOOD BLOCK
MEMTST7A   EQU     $
           OR      M[RAMSTS],DL       ACCUMULATE RAM TEST RESULT

SAVE ENTRIES FOR CONFIG TABLE

MOV     AX,PARA@
           MOV     DS,AX              ;SET DATA SEG TO PARA0
           MOV     BX,M[MEMPTR]       ;MX = PTR TO MEM CNFG TABLE
           MOV     DI,M[MEMSZ]        ;DI = # OF ENTRIES
           SAL     DI,1
           SAL     DI,1               ;ADJUST DI FOR ENTRY OF 4 BYTES
           MOV     M[BX+DI+3],DL      ;SAVE RAM BLOCK TEST STATUS BYTE
           MOV     AL,M[SLOT@]
           MOV     M[BX+DI+2],AL      ;SAVE SLOT # BYTE
           MOV     AL,0               ;AL = 0
           MOV     AH,M[PARA@]        ;AH = BASE ADR OF MEM CONTR
           ADD     AH,M[OFF16]        ;ADD OFFSET ADR OF 16K BYTE BLOCK
           MOV     M[BX+DI],AX        ;ENTER ADDR FIELD
           INC     WORD PTR M[MEMSZ]  ;INC TABLE SIZE
           ADD     M[OFF16],X'40'     ;FORM OFFSET TO NEXT BLOCK
```

*Fig. 23.*

IS THERE MORE RAM ON CONTR?

```
         DEC    M[BLOCK@]        ;IS 64K BYTE TESTED?              C11
         JZ     MEMTST8          ;YES, THEN EXIT
         DEC    M[CNFGBLK]       ;ARE ALL CNFG BLOCKS TESTED?
         JNZ    MEMTST7          ;NO, THEN TEST THEM
         CALL   RAM?             ;DETERMINE IF MORE RAM ON CONTR
         OR     DL,DL            ;DOES SELF TEST DETECT MORE RAM?
         JNZ    MEMTST7          ;VERIFY ANY MORE RAM
```

COME HERE AT THE END OF ONE CONTROLLER

```
MEMTST8  EQU    $
         ADD    M[PARA@],X'10'   ;FORM NEXT PARA ADDR AVAILABLE    C12
MEMTST9  EQU    $
         INC    M[SLOT@]         ;POINT TO NEXT IOC SLOT
         CMP    M[SLOT@],10      ;ARE ALL SLOTS TESTED?
         JLE    MEMTST4          ;NO THEN CONTINUE SEARCH          C13
```

ALL AVAILABLE RAM HAS BEEN TESTED
IS THERE A GOOD 16K BLOCK OF RAM?

```
         TEST   M[GOOD16],1      ;IS GOOD BLOCK FLAG SET?          C14
         JNE    MEMTST3          ;NO, THEN REPEAT IOC RAM TEST
```

END OF MEMORY TEST
------------------
```
         JMP    SELFLP3          ;CONTINUE WITH NEXT TEST          C15
```

*Fig. 24.*

```
               ------------
               MPC RAM TEST
               ------------
               ON RETURN:  DL = 0 NO ERROR
                        :  DL > 0 ACCUMULATED DATA BITS IN ERROR

MPCRAM         EQU    $                                                          C2-0
               MOV    CX,MPCRAMS        ;CX = MPC RAM SIZE           ⎫
               LDS    BX,MPCRAMB        ;SET BOTTOM ADDR OF RAM      ⎬ C2-1
               MOV    DH,0              ;PARA #                      ⎭
               MOV    BP,MPCRAM@        ;BP = RETURN ADDRESS         ⎫ C2-2
               JMP    RAMTST            ;TEST DESIRED RAM            ⎭

MPCRAM@:       JMP    MEMTST2           ;RETURN TO CONTINUE MEM TEST            C2-3

TEST 16K BYTE BLOCK OF IOC RAM
               ------------------------------

ON RETURN:  DL = 0 NO ERROR
                        :  DL > 0 ACCUMULATED ERROR BITS

IOCRAM         EQU    $                                                          C9-0
               MOV    BL,0                                                       C9-1
               MOV    BH,M[OFF16]       ;BX = OFFSET ADR TO RAM TO BE TESTED
               MOV    CX,X'4000'        ;CX = SIZE OF RAM TO BE TESTED
               MOV    DH,M[PARA@]       ;DH = PARA # WHERE RAM IS LOCATED
               MOV    BP,IOCRAM@        ;BP = RETURN ADDRESS
               JMP    RAMTST            ;TEST 16K BLOCK OF RAM                   C9-2
IOCRAM@:       RET                      ;RETURN                                  C9-3

ROUTINE TO SEARCH FOR RAM IN NEXT 16K BYTE BLOCK
               -------
               ON RETURN:  DL = 0 NO RAM DETECTED
                        :  DL = 1 RAM DETECTED

RELIES ON THE FACT THAT A REFERENCE TO ANY NON-EXISTENT RAM
               LOCATION RESULTS IN ALL DATA BITS BEING 1'S (I.E., DATA = -1)
               USE 16 LOCATIONS FOR THIS CHECK

RAM?:          PUSH   DS                ;SAVE DATA SEG VALUE                     C11
               MOV    BL,0
               MOV    BH,M[PARA@]       ;BX = PARA # ADDR
               MOV    DS,BX             ;SET DATA SEG TO WHERE RAM IS TO BE SEARCHED
               MOV    DL,1              ;START WITH FLAG FOR RAM PRESENT
               MOV    AL,X'69'
               MOV    CX,16             ;CX = LOCATION COUNTER
               MOV    BH,M[OFF16]       ;BX = PTR TO BOTTOM OF BLOCK
RAM?1:         MOV    M[BX],AL          ;WRITE SOMETHING TO LOCATION
               TEST   M[BX],X'FF'       ;TEST FOR NON-EXISTENT MEMORY
               JNZ    RAM?2             ;EXIT IF RAM IS PRESENT
               INC    BX                ;POINT TO NEXT LOCATION
               LOOP   RAM?1             ;LOOP FOR 16 LOCATIONS
               MOV    DL,0              ;SET INDICATOR TO NO RAM
RAM?2:         POP    DS                ;RESTORE DATA SEG
               RET                      ;RETURN
```

*Fig. 25.*

```
            TEST RAM

ON ENTRY : BX = OFFSET ADR OF RAM TO BE TESTED
                     : CX = SIZE OF RAM TO BE TESTED
                     : DH = PARA # WHERE RAM RESIDES
                     : BP = RETURN ADDRESS

ON RETURN: DL = 0  NO ERROR
                       DL > 0  ACCUMULATED ERROR BITS

RAMTST      EQU       $                                                       C2-2-0

MOV       DL,0              ;CLEAR ERROR INDICATOR         ⎫
            MOV       DS,DX             ;ASSIGN DATA SEGMENT           ⎬ C2-2-1
            MOV       SI,CX             ;SAVE RAM SIZE IN SI           ⎪
            MOV       DI,BX             ;SAVE RAM ADR IN DI            ⎭

WRITE TEST PATTERN = (MSB - LSB) OF TEST ADDR + PARA #

RAMTST1:    MOV       AL,BH             ;AL = MSB OF TEST ADDR         ⎫
            SUB       AL,BH             ;AL = MSB-LSB OF TEST ADR      ⎪
            ADD       AL,DH             ;AL = TEST PATTERN             ⎬ C2-2-2
            MOV       M[BX],AL          ;WRITE PATTERN TO TEST ADDR    ⎪
            INC       BX                ;POINT TO NEXT ADDR            ⎪
            LOOP      RAMTST1           ;REPEAT FOR ENTIRE RAM         ⎭

VERIFY DATA PATTERN AND COMPLEMENT PREVIOUS DATA

MOV       CX,SI             ;CX = RAM SIZE                 ⎫
            MOV       BX,DI             ;BX = PTR TO BOTTOM OF RAM     ⎪
RAMTST2:    MOV       AL,BH             ;AL = MSB OF TEST ADDR         ⎪
            SUB       AL,BL             ;AL = MSB-LSB OF TEST ADR      ⎪ C2-2-3,
            ADD       AL,DH             ;AL = EXPECTED TEST PATTERN    ⎬ C2-2-4,
            XOR       AL,M[BX]          ;VERIFY LOCATION, AL = 0 -> NO ERROR  C2-2-5
            OR        DL,AL             ;ACCUMULATE ANY FAILED DATA BITS ⎪
            NOT       M[BX]             ;COMPLEMENT TEST PATTERN       ⎪
            INC       BX                ;POINT TO NEXT TEST ADDR       ⎪
            LOOP      RAMTST2           ;VERIFY ENTIRE RAM             ⎭

VERIFY COMPLEMENTED DATA PATTERN IN REVERSE ORDER
            ALSO CLEAR MEMORY TO ZERO

MOV       CX,SI             ;CX = RAM SIZE                 ⎫
RAMTST3:    DEC       BX                ;POINT TO PREVIOUS TEST ADDR   ⎪
            MOV       AL,BH             ;AL = MSB OF TEST ADDR         ⎪
            SUB       AL,BL             ;AL = MSB-LSB OF TEST ADDR     ⎪ C2-2-6,
            ADD       AL,DH             ;AL = MSB-LSB OF ADR + PARA #  ⎬ C2-2-7
            NOT       AL                ;COMPLEMENT TO FORM EXPECTED DATA ⎪
            XOR       AL,M[BX]          ;VERIFY LOCATION, AL = 0 -> NO ERROR ⎪
            OR        DL,AL             ;ACCUMULATE ANY FAILED DATA BITS ⎪
            MOV       M[BX],0           ;CLEAR TEST LOCATION           ⎪
            LOOP      RAMTST3           ;CONTINUE FOR ENTIRE RAM       ⎭

END OF RAM TEST

JMP       BP                ;RETURN TO ADDRESS IN BP       C2-2-8
```

*Fig. 26.*

```
                    -----------------------
                    REAL TIME CLOCK TEST
                    -----------------------
RTCTST      EQU       $                                                               D0

ASSIGN RTC IV

CALL      IVSPUR          ;ASSIGN SPURIOS IV TO ALL LEVELS                D1
            PUSH      ES              ;SAVE ES
            MOV       SI,4*RTCIL      ;SI = INDEX PTR TO RTC IL
            LES       BX,RTCIV        ;GET ABSOLUTE PTR TO IV
            MOV       M[SI],ES        ;ENTER HIGH ADR WORD OF IV
            MOV       M[SI+2],BX      ;ENTER LOW ADR WORD OF IV
            POP       ES              ;RESTORE ES

TEST FOR RTC NOT INTERRUPTING WHEN ENABLED

RTCTST1:    LEA       BX,INTRCV       ;BX = PTR TO INT-RCV BYTE
            MOV       M[BX],0         ;CLEAR INT RECV FLAG
            OUT       RTCENB,AL       ;ENABLE RTC                                     D2
            EI                        ;ENABLE PROCESSOR INTERRUPTS
            MOV       AH,22
            CALL      WAIT            ;WAIT FOR ABOUT 22 MSEC                         D3
            CMP       M[BX],0         ;MUST RECV RTC INTR BY NOW
            JZ        RTCTST          ;OTHERWISE RTC ERROR - SO REPEAT RTC TEST       D4

TEST RTC INTERRUPTING TOO EARLY

MOV       M[BX],0         ;CLEAR RTC INTR FLAG
RTCTST2:    CMP       M[BX],0
            JZ        RTCTST2         ;SYNCHRONIZE WITH RTC INTR                      D5
            DEC       M[BX]           ;CLEAR RTC INTR FLAG
            MOV       AH,15
            CALL      WAIT            ;WAIT FOR ABOUT 15 MSEC                         D6
            CMP       M[BX],0         ;RTC SHOULDN'T INTERRUPT
            JNZ       RTCTST          ;OTHERWISE RTC ERROR - SO REPEAT THIS TEST      D7

TEST FOR RTC INTERRUPTING WHEN DISABLED

OUT       DSBRTC,AL       ;DISABLE RTC
            MOV       M[BX],0         ;CLEAR INTR FLAG                                D8
            MOV       AH,30
            CALL      WAIT            ;WAIT FOR ABOUT 30 MSEC                         D9
            CMP       M[BX],0         ;RTC SHOULDN'T INTERRUPT
            JNZ       RTCTST          ;OTHERWISE RTC ERROR - SO REPEAT THIS TEST      D10

END OF RTC TEST
            ---------------
            RET                       ;RETURN                                         D11
```

*Fig. 27.*

```
                    MPC LOOP-BACK COMMUNICATIONS TEST
                    ----------------------------------

LPBKTST     EQU     $                                                               E0

MOV     DL,0              ;CLEAR ERROR INDICATOR              ⎫
            MOV     AL,LEDCOMM        ;AL = DISPLAY CODE FOR THIS TEST    ⎬ E1
            NOT     AL                                                    ⎪
            OUT     LEDPORTA,AL       ;DISPLAY TEST RUNNING               ⎭

PERFORM LOCAL LOOPBACK WITH PATTERNS:
                    1. '1' ROTATED IN THE TEST BYTE
                    2. '0' ROTATED IN THE TEST BYTE

CALL    LPBKCNFG          ;CONFIG MPC 2651 FOR LOCAL LOOPBACK    E2
            MOV     AL,1              ;INIT AL WITH PATTERN 1              ⎫
            CALL    LPBKDATA          ;LOOPBACK DATA AND VERIFY            ⎬ E4,E5
            MOV     AL,X'FE'          ;INIT AL WITH PATTERN 2              ⎪
            CALL    LPBKDATA          ;PERFORM LOOPBACK                    ⎭

END OF LOOPBACK TEST
            --------------------
            MOV     M[LPBKSTS],DL     ;SAVE LOOPBACK TEST RESULT           ⎫
            MOV     AL,0                                                   ⎬ E6
            OUT     COMM7,AL          ;DISABLE X-MITTER & RECEIVER         ⎭
            RET                       ;RETURN                                E7

CONFIGURE 2651 FOR LOCAL LOOPBACK
            ---------
LPBKCNFG    EQU     $                                                               E2,E3

MOV     AL,01011110B      ;WRITE MODE REG 1 FOR ASYNC COMM WITH 8 BITS/CH
            OUT     COMM6,AL          ;  ODD PARITY ENABLED AND 1 STOP BIT/CHAR
            MOV     AL,00111100B      ;WRITE MODE REG 2 TO ENABLE INTERNAL CLOCK
            OUT     COMM6,AL          ;  AT 4800 BITS/SEC
            MOV     AL,10100111B      ;WRITE CMMND REG FOR LOCAL LOOPBACK
            OUT     COMM7,AL          ;  AND ENABLE X-MITTER & RECEIVER

RET                       ;RETURN

LOOPBACK & VERIFY DATA THRU MPC 2651
            ------------------------------------
            ON RETURN:  DL = 0 NO ERROR
                     :  DL > 0 ACCUMULATED ERROR BITS

LPBKDATA    EQU     $                                                               E4,E5

MOV     CX,8              ;SET LOOP COUNT TO # OF BITS IN A BYTE
            MOV     BH,-1             ;SET TIME-OUT COUNTER

CHECK FOR X-MITTER READY

LPBKD1:     IN      AH,COMM1          ;READ 2651 STS REG
            SAR     AH,1              ;CF = X-MIT STS BIT
            JNAE    LPBKD2            ;JUMP TO X-MIT IF CF = 1
            DCR     BX                ;DECREMENT TIME-OUT COUNT
            JNE     LPBKD1            ;RETRY UNTIL 2651 TIMES OUT
            MOV     DL,-1             ;SET ERROR INDICATOR
            JMP     LPBKD5            ;EXIT
```

*Fig. 28.*

```
                X-MIT BYTE AND CHECK RECEIVER STS

LPBKD2:   OUT    COMM4,AL           ;X-MIT TEST BYTE              E4,E5
LPBKD3:   IN     AH,COMM1           ;READ STATUS
          SAR    AH,1
          SAR    AH,1               ;CF = RECV STS BIT
          JNAE   LPBKD4             ;JUMP TO RECV DATA IF CF = 1
          DCR    BX                 ;DECREMENT TIME-OUT COUNT
          JNE    LPBKD3             ;RETRY UNTIL 2651 TIMES-OUT
          MOV    DL,-1              ;SET ERROR INDICATOR
          JMP    LPBKD5             ;EXIT

READ AND VERIFY LOOPBACK BYTE

LPBKD4:   IN     DH,COMM0           ;DH = RECV DATA BYTE
          XOR    DH,AL              ;VERIFY RECV DATA, DH = 0 -> NO ERROR
          OR     DL,DH              ;ACCUMULATE ANY BITS IN ERROR

FORM NEXT TEST BYTE

RCL    AL,1               ;ROTATE PATTERN IN THE TEST BYTE
          MOV    BH,-1              ;INIT TIME-OUT COUNT
          LOOP   LPBKD1             ;REPEAT LOOPBACK 8 TIMES

END OF THIS ROUTINE
          -------------------
LPBKD5:   RET                       ;RETURN
```

*Fig. 29.*

```
-----------------------------------------
DISPATCHER FOR ROM SIGNATURE CALCULATION
-----------------------------------------
SIGNATURES ARE STORED IN SIGTBL AREA
```

| | | | | |
|---|---|---|---|---|
| SIGNTRE | EQU | $ | | F0 |
| | UPDATE LED DISPLAY | | | |
| | MOV | AL,LEDSIG | | ⎫ |
| | NOT | AL | | ⎬ F1 |
| | OUT | LEDPORTA,AL | ;DISPLAY TEST RUNNING ON LED'S | ⎭ |
| | DISPATCH TO CALCULATE SIGNATURE FOR EACH 1KBYTE OF ROM | | | |
| | XOR | AX | ;AX = 0 | F2 |
| | MOV | DS,AX | ;ASSIGN DATA SEGMENT | |
| | MOV | ES,AX | ;ASSIGN EXTRA SEGMENT | |
| | CLD | | ;CLEAR DF FOR FORWARD DIRECTION | |
| | MOV | CX,32 | ;CX = 2 * # OF 2K-PROM's | |
| | MOV | BX,SIGTBL | ;BX = BOTTOM OF ROM SIGNATURE SAVE AREA | |
| | MOV | M[SIGBUF],BX | ;INIT ROM SIG BUFFER ADDR | |
| | MOV | DX,0 | ;INIT ROM ADDRESS | |
| SIGNTLP: | MOV | M[ROMADR],DX | ;SAVE ROM ADDR | ⎫ F3 |
| | PUSH | CX | ;SAVE CX | ⎭ |
| | CALL | SIGC | ;CALCULATE SIGNATURE | |
| | CLD | | ;DF = 1 FOR FORWARD DIR | F4 |
| | MOV | SI,SIG | ;SI = PTR TO SIG JUST CALCULATED | |
| | MOV | DI,M[SIGBUF] | ;DI = PTR TO SIG SAVE AREA | |
| | MOV | AX,M[ROMADR] | ;AX = ADR OF ROM | |
| | STOS | AX | ;ENTER ADR OF ROM IN SIG CNFG TABLE | |
| | MOV | CX,4 | ;CH = # OF SIG BYTES | |
| | REP | MOVS | ;MOVE 4 BYTE SIGNATURE TO SIG SAVE AREA | |
| | MOV | M[SIGBUF],DI | ;SAVE PTR TO SIG TABLE | |
| | MOV | DX,AX | ;DX = ADR OF ROM | ⎫ F5 |
| | ADD | DX,ROMSIZE | ;DX = NEXT ROM ADDRESS | ⎭ |
| | POP | CX | ;RESTORE LOOP COUNTER | ⎫ F6 |
| | LOOP | SIGNTLP | ;CONTINUE FOR ALL ROM'S | ⎭ |
| | RET | | ;RETURN | F7 |

```
ROUTINE TO CALCULATE ROM SIGNATURE
----------------------------------
ON ENTRY :  DX = ROM ADDRESS

ON RETURN:  SIG TO SIG+3 = SIGNATURE
```

-----------------------------------------------------------------------

SIGNATURE RETURNED IS OF 4 BYTES CONTAINING 8 BCD DIGITS
IN LOCATIONS SIG THROUGH SIG+3
THIS SIGNATURE = THE SIGNATURE ON PROM PAPER TAPE

THE PROCEDURE FOR CALCULATING THE SIGNATURE WORD IS AS FOLLOWS:
A. SIGNATURE = 00000000
B. SIGNATURE = 2 * SIGNATURE
C. SIGNATURE = SIGNATURE + DATA BYTE
D. IF A CARRY OUT OF THE MOST SIGNIFICANT DIGIT OCCURS,
      THEN SIGNATURE = SIGNATURE + 1
E. IF 1024 BYTES ACCUMULATED, THEN DONE
      ELSE GO TO STEP B

---

INITIALIZE THE SIGNATURE TO 00000000

```
SIGC:   MOV     BX,SIG          ;BX = PTR TO SIGN BUFFER         F3
        MOV     CX,8            ;CX = # OF WORK BYTES
SIG1:   MOV     M[BX],0         ;CLEAR A WORK BYTE
        INC     BX              ;POINT TO NEXT BYTE
        LOOP    SIG1            ;CLEAR ALL WORK AREA
```

INITIALIZE SIGR2 AND SIGR3
SIGR2 POINTS TO THE DATA BEING ANALYZED
SIGR3 IS THE NUMBER OF BYTES REMAINING IN THE FIELD

```
        MOV     M[SIGR2],DX              ;SIGR2 POINTS TO THE DATA
        MOV     WORD PTR[SIGR3],ROMSIZE  ;SIGR3 = ROMSIZE (I.E., 1K)
```

MULTIPLY SIGNATURE BY 2

```
SIG2:   MOV     BX,SIG          ;BX = PTR TO SIGNATURE
        MOV     CX,8            ;CX = # OF SIGNATURE BYTES
SIG3:   SAL     M[BX],1         ;MULTIPLY SIG BYTE BY 2
        INC     BX              ;BX = PTR TO NEXT SIGNATURE BYTE
        LOOP    SIG3            ;LOOP FOR 8 BYTES
        CALL    SIG8            ;ADJUST CARRIES
```

GET NEW DATA BYTE FROM SELECTED ROM

```
        MOV     BX,WORD PTR[SIGR2]   ;BX POINTS TO THE DATA
        MOV     AL,CS:M[BX]     ;AL = ROM DATA BYTE
        INC     WORD PTR [BX]   ;UPDATE THE PONTER
```

ADD NEW DATA BYTE TO SIGNATURE
FIRST UPDATE HUNDREDS DIGIT

```
        MOV     BX,SIG+5        ;BX = PTR TO CURRENT HUNDREDS DIGIT
SIG4:   CMP     AL,100
        JL      SHORT SIG5      ;EXIT IF DATA IS <100
        INC     M[BX]           ;UPDATE HUNDREDS DIGIT
        SUB     AL,100          ;DATA = DATA - 100
        JMP     SIG4            ;AND LOOP
```

UPDATE TENS DIGIT

```
SIG5:   INC     BX              ;BX = PTR TO TENS DIGIT
        MOV     CH,0
SIG6:   CMP     AL,10
        JL      SHORT SIG7      ;EXIT IF A <10
        INC     CH              ;UPDATE TENS DIGIT COUNTER
        SUB     AL,10           ;A=A-10
        JMP     SIG6            ;AND LOOP
```

CH NOW CONTAINS TENS DIGIT VALUE
A NOW CONTAINS THE UNITS VALUE

*Fig. 31.*

```
SIG7:     ADD   M[BX],CH         ;UPDATE TENS DIGIT OF SIGNATURE
          INC   BX               ;BX = PTR TO CURRENT UNIT DIGIT
          ADD   M[BX],AL         ;UPDATE UNITS DIGIT OF SIGNATURE
          CALL  SIG8             ;ADJUST CARRIES FOR SIGNATURE

ONE DIGIT IS DONE

SIG10:    DEC   WORD PTR [SIGR3] ;DECREMENT BYTE COUNT
          JNZ   SIG2             ;CALCULATE SIG FOR 1K OF ROM

SIGNATURE HAS BEEN CALCULATED
          PACK IT IN 4 BYTES OF 8 BCD DIGITS

MOV   SI,SIG           ;SI = PTR TO SIGNATURE BUFFER
          MOV   DI,SIG           ;DI = PTR TO SIGNATURE BUFFER
          MOV   CH,4             ;CH = LOOP COUNTER
SIG11:    LODS  AX               ;AX = 2 SIGN BYTES
          MOV   CL,4
          SAL   AL,CL            ;SHIFT LEFT 4 TIMES TO MOVE TO HIGH NIBBLE
          OR    AL,AH            ;PACK 2 BYTES INTO 1 BYTE OF 2BCD DIGITS
          STOS  AL               ;WRITE PACKED BYTE INTO SIGNATURE BUFFER
          DEC   CH               ;DECREMENT LOOP COUNTER
          JNZ   SIG11            ;PACK ENTIRE SIGNATURE IN 4 BYTES

END OF SIGNATURE CALCULATION
          ----------------------------
          RET                    ;END OF SIGNATURE CALCULATION - R E T U R N

ROUTINE TO ADJUST THE CARRIES FOR SIGNATURE
          -------------------------------------------
SIG8:     CLC                    ;CLEAR CARRY FLAG, CY = 0
SIG8A:    MOV   BX,SIG+7         ;BX = PTR TO UNITS DIGIT
          MOV   CX,8             ;CX = # OF BYTES OF SIGNATURE
          ADC   M[BX],0          ;INC UNITS DIGIT IF CY = 1

ADJUST CARRY FOR A BYTE

SIG8B:    MOV   AL,M[BX]         ;AL = DIGIT FROM SIGNATURE
          ADC   AL,0             ;AL = AL+CY
          CMP   AL,10            ;CHECK IF WITHIN DECIMAL BOUND
          JAE   SHORT SIG8C      ;JUMP IF CY = 0 ( A >= 10)
          DAA                    ;DECIMAL ADJUST
          AND   AL,OFH           ;MASK-OFF 4 MOST SIGNIFICANT BITS
          STC                    ;CY = 1
SIG8C:    MOV   M[BX],AL         ;UPDATE CARRY ADJUSTED DIGIT

REPEAT CARRY ADJUST PROCESS FOR 8 BYTES

DEC   BX               ;POINT TO NEXT SIGNATURE BYTE
          LOOP  SIG8B            ;ADJUST CARRY FOR ALL 8 BYTES

NOW CHECK FOR CARRY OUT OF THE MOST SIGNIFICANT DIGIT
          AND ADD IT INTO THE LEAST SIGNIFICANT DIGIT

JNAE  SIG8A            ;REPEAT ADJUST PROCESS IF CY = 1
          RET                    ;RETURN
```

*Fig. 32.*

```
                CONTROLLER I/O TEST
                -------------------

IOTST    EQU    $                                                          G0

INITIALIZE TEST PARAMETERS

XOR    AX,AX           ;AH = AL = 0                               G1
         MOV    M[CSLFSTS],AL   ;CLEAR CONTROLLER SELF TEST STS BYTE
         MOV    M[IRSTS],AL     ;CLEAR INTERRUPT RESPONSE STS BYTE
         MOV    M[SLOT@],AL     ;INIT IOC SLOT # TO ZERO
         MOV    M[IOSLOT],AL    ;CLEAR FAILED IO SLOT INDICATOR
         MOV    M[IOSZ],AX      ;INIT TO CNFG TABLE SIZE TO 0
         MOV    AX,IOTBL        ;AX = PTR TO IO CNFG TABLE
         MOV    M[IOPTR],AX     ;INIT PTR TO IO CNFG TABLE

UPDATE LED DISPLAY

IOTSTLP  EQU    $                                                          G2
         MOV    AL,M[SLOT@]     ;AL = SELECTED IOC SLOT
         MOV    CL,4            ;CL = SHIFT COUNT
         SAL    AL,CL           ;HIGH NIBBLE OF AL = SLOT #
         OR     AL,LEDIO        ;ADD IO TEST #
         NOT    AL              ;COMPLEMENT TO LIGHT UP LED
         OUT    LEDPORTA,AL     ;UPDATE LED DISPLAY

DETERMINE CONTROLLER ID AND CONFIGURATION BYTES
         ENTER ABOVE IN THE CONFIGURATION TABLE
         ALSO GET CONTROLLER SELF TEST STATUS FOR ONE HAVING SUCH CAPABILITY

CALL   CSLFTST                                                    G3

TEST INTERRUPT RESPONSE AND CONTENTION

CALL   IVTST                                                      G4

COME HERE AT THE END OF ONE CONTROLLER

INC    WORD PTR M[IOSZ]  ;INC # OF ENTRIES IN CNFG TABLE
         INC    M[SLOT@]          ;POINT TO NEXT IOC SLOT              G5,G6
         CMP    M[SLOT@],10       ;ARE ALL SLOTS TESTED?
         JLE    IOTSTLP           ;NO, THEN CONTINUE IO TEST

ALL SLOTS HAVE BEEN TESTED
         DISPLAY LED 12 AS PER INTERRUPT TEST STATUS

MOV    AL,M[IRSTS]     ;AL = INTERRUPT RESPONSE STS (0 = PASS)    G7
         SAL    AL,1
         SAL    AL,1            ;BIT 2 OF AL = DATA FOR LED 12
         NOT    AL
         OUT    LEDPORTB,AL     ;DISPLAY LED 12

END OF IO TEST
         --------------
         RET                    ;RETURN                                    G8
```

Fig. 33.

```
-----------------------------------------------------------
            ROUTINE FOR CONTROLLER SELF TEST STS AND CONFIGURATION
-----------------------------------------------------------
CSLFSTS     EQU     $

GET CONTROLLER ID & ENTER IN CNFG TABLE

MOV     BX,M[IOPTR]     ;BX = PTR TO IO CNFG TABLE           G3-1
            MOV     DI,M[IOSZ]      ;DI = # OF ENTRIES IN CNFG TABLE
            SAL     DI,1            ;ADJUST INDEX FOR ENTRY OF 5 BYTES
            SAL     DI,1            ;       "               "
            ADD     DI,M[IOSZ]      ;       "               "
            MOV     DL,IDPORT       ;DL = PORT # FOR ID READ
            MOV     DH,M[SLOT@]     ;DH = SLOT # = GROUP PORT #
            IN      AL,DX           ;AL = CONTROLLER ID
            MOV     M[BX+DI],DH     ;ENTER IO SLOT # IN THE TABLE
            MOV     M[BX+DI+1],DL   ;ENTER CONTROLLER ID IN THE TABLE

INDICATE CONTROLLER SELF TEST STATUS

SAL     AL,1            ;DOES CONTROLLER HAS SELF TEST?      G3-2
            JAE     CSLFTST1        ;NO THEN SKIP THIS OPERATION
            SAL     AL,1            ;CF = CONTR SELF TEST STS (0 = PASS)
            JAE     CSLFTST1        ;SKIP ERROR INDICATION FOR PASS CONDITION
            MOV     M[CSLFSTS],1    ;SET FLAG FOR SELF TEST FAILED
            MOV     M[IOSTS],1      ;SET IO TEST FAIL STS
CSLFTST1    EQU     $

GET CONTROLLER CONFIGURATION BYTES

MOV     DL,CNFGPRT1     ;DL = PORT # FOR CNFG BYTE 1         G3-3
            IN      AL,DX           ;AL = CNFG BYTE 1
            MOV     M[BX+DI+2],AL   ;ENTER CNFG BYTE 1 IN TABLE
            MOV     DL,CNFGPRT2     ;DL = PORT # FOR CNFG BYTE 2
            IN      AL,DX           ;AL = CNFG BYTE 2
            MOV     M[BX+DI+3],AL   ;ENTER CNFG BYTE 2 IN THE TABLE

END OF THIS ROUTINE

RET                     ;RETURN                              G3-4
```

*Fig. 34.*

```
                    ------------------------------------------
                    INTERRUPT RESPONSE AND CONTENTION TEST
                    ------------------------------------------

IVTST       EQU     $                                                                   G4-0

ASSIGN INTERRUPT VECTOR

CALL    IVSPUR          ;ASSIGN IV FOR SPURIOUS INTERRUPT                    G4-1
                    MOV     AL,M[SLOT@]     ;AL = SLOT #
                    ADD     DL,10           ;AL & AL+1 = EXPECTED IL
                    SAL
                    SAL                     ;AL = OFFSET PTR TO IV
                    MOV     AH,0            ;AH = 0
                    MOV     SI,AX           ;SI = INDEX TO IV
                    PUSH    ES
                    LES     BX,EXPIV        ;ES,BX = ADDR OF IV
                    MOV     M[SI],ES        ;SET IV AT EXP IL - ENTER HIGH ADR WORD OF IV
                    MOV     M[SI+2],BX      ;ENTER LOW ADR WORD OF IV
                    MOV     M[SI+4],ES      ;SET IV AT NEXT EXP IL
                    MOV     M[SI+6],BX
                    POP     ES

ISSUE INTERRUPT REQUEST AND WAIT FOR RESPONSE

IVTST1      EQU     $                                                                   G4-2
                    MOV     M[INTRCV],0     ;CLEAR INT RCV FLAG
                    MOV     M[INTSPUR],0    ;CLEAR SPUR INT FLAG
                    MOV     DL,TESTCMPT     ;DL = PORT # TO ENABLE INT TEST
                    MOV     DH,M[SLOT@]     ;DH = PORT GROUP #
                    OUT     DL,AL           ;ENABLE INTERRUPT TEST
                    MOV     DL,INTTST       ;DL = PORT # FOR INTR REQUEST
                    OUT     DX,AL           ;ISSUE INTR REQUEST TO CONTROLLER
                    MOV     AH,1
                    CALL    WAIT            ;WAIT FOR ABOUT 1 MSEC
                    MOV     DL,TIACKPT
                    OUT     DL,AL           ;SEND INTR ACK TO CONTROLLERS

DETERMINE IF RESPONSE IS RECEIVED AT EXPECTED LEVELS

IVTST2      EQU     $                                                                   G4-3
                    MOV     AL,0            ;AL = 0
                    CMP     M[INTSPUR],0    ;IS SPURIOUS INTR FLAG SET?
                    JNZ     IVTST3          ;YES, THEN SPURIOUS INTR ERROR
                    MOV     AL,M[INTRCV]    ;AL = # OF INTR'S RECEIVED
                    CMP     AL,0                                                                G4-4
                    JZ      IVTST5          ;EXIT IF NO INTR IS RECEIVED

DETERMINE IF THERE IS ANY INTR CONTENTION

CMP     M[INTPRV],2     ;DOES PREVIOUS CONTR NEED 2 LEVELS?                  G4-5
                    JZ      IVTST3          ;YES THEN THERE IS INTR CONTENTION
                    MOV     M[INTPRV],AL    ;UPDATE PREVIOUS INTR COUNT
                    DEC     AL
                    ROR     AL,1            ;BIT 7 OF AL = 1 FOR 2 LEVELS
                    JMP     IVTST4          ;SAVE RESULTS IN CNFG TABLE

COME HERE FOR INTR CONTENTION OR SPURIOUS INTR

IVTST3      EQU     $
                    MOV     M[IRSTS],1      ;SET INTR RESPONSE ERROR FLAG                       G4-6
                    MOV     M[IOSTS],1      ;SET IO TEST ERROR FLAG
                    OR      AL,X'40'        ;SET INTR TEST FAILED BIT FOR CNFG TABLE
                    MOV     AH,M[SLOT@]
                    MOV     M[IOSLOT],AH    ;ENTER SLOT # THAT FAILS THIS TEST

ENTER INTR TEST RESULT IN THE CNFG TABLE
```

*Fig. 35.*

```
IVTST4    EQU     $
          OR      AL,M[SLOT@]      ;RECALL, INT LEVEL = SLOT # + 10      G4-7
          ADD     AL,10            ;ADD INT LEV VALUE TO TEST RESULT
          MOV     BX,M[IOPTR]      ;BX = PTR TO IO CNFG TABLE
          MOV     DI,M[IOSZ]       ;DI = # OF ENTRIES IN TABLE
          SAL     DI,1             ;ADJUST INDEX FOR ENTRY OF 5 BYTES
          SAL     DI,1
          ADD     DI,M[IOSZ]
          MOV     M[BX+DI+4],AL    ;ENTER INTR TEST RESULT IN CNFG TABLE

END OF INTERRUPT RESPONSE TEST
          ------------------------------
IVTST5:   RET                      ;RETURN                               G4-8

------------------------------
          CREATE SYSTEM CONFIGURATION HERE
          ------------------------------

SYSCNFG   EQU     $                                                      H0

UPDATE LED DISPLAY

MOV     AL,LEDCNFG       ;AL = CNFG TEST #
          NOT     AL                                                     }H1
          OUT     LEDPORTA,AL      ;DISPLAY TEST RUNNING ON LED'S

CREATE CONFIGURATION TABLES

CALL    MEMCNFG          ;CREATE MEMORY CONFIGURATION          H2
          CALL    SIGCNFG          ;CREATE SIGNATURE CONFIGURATION       H3
          CALL    IOCNFG           ;CREATE I/O CONFIGURATION             H4

END OF CONFIGURATION

RET                      ;RETURN                               H5

----------------------
          CONFIGURE SYSTEM MEMORY
          ----------------------

- MEM CNFG TABLE WAS CREATED WHILE TESTING RAM

- MEMPTR = PTR TO MEM CNFG TABLE
                  - MEMSZ  = # OF ENTRIES IN MEM CNFG TABLE
                            (EACH ENTRY = 4 BYTES)

MEMCNFG:  RET                      ;RETURN

--------------------
          CONFIGURE SIGNATURES
          --------------------

- SIG CNFG TABLE WAS CREATED AT SIG CALCULATION TIME

- SIGPTR = PTR TO SIG CNFG TABLE
                  - SIGSZ  = # OF ENTRIES IN SIG CNFG TABLE
                            (EACH ENTRY = 6 BYTES)

SIGCNFG:  RET                      ;RETURN
```

*Fig. 36.*

```
              -------------
              CONFIGURE I/O
              -------------

- IO CNFG TABLE CREATED WHILE TESTING IO

- IOPTR = PTR TO IO CNFG TABLE
                     - IOSZ  = # OF ENTRIES IN IO CNFG TABLE
                                         (EACH ENTRY = 5 BYTES)

IOCNFG:    RET                       ;RETURN

---------------------------------------
           ROUTINE TO DETERMINE SELF TEST STATUS
                 AND DISPLAY STATUS ON LED'S
           ---------------------------------------

TSTSTS     EQU       $

DETERMINE SELF TEST STATUS

XOR       AX,AX           ;AL = AH = 0                              I0
           CMP       M[RAMSTS],AL    ;RAM TEST STS?
           JZ        TSTSTS1         ;SKIP ERROR ENTRY IF PASS CONDITION
           OR        AL,1            ;ENTER RAM TEST FAIL STS
TSTSTS1:   CMP       M[LPBKSTS],AH   ;CHECK COMM LOOPBACK TEST STS
           JZ        TSTSTS2         ;SKIP ERROR UPDATE IF PASS CONDITION
           OR        AL,2            ;ENTER LOOPBACK FAIL STS
TSTSTS2:   CMP       M[IOSTS],AH     ;CHECK IO TEST STS?
           JZ        TSTSTS3         ;SKIP ERROR UPDATE IF PASS CONDITION
           OR        AL,4            ;ENTER IO TEST FAIL STS
           MOV       AH,M[IOSLOT]    ;AH = IO SLOT THAT FAILED
           MOV       CL,4
           SAL       AH,CL           ;HIGH NIBBLE OF AH = IO SLOT #
           OR        AL,AH           ;ENTER SLOT # IN STS BYTE
TSTSTS3:   MOV       M[SELFSTS],AL   ;ENTER SELF TEST STS IN CONTROL AREA

DISPLAY STATUS PATTERN ON LED'S

XOR       DL,DL           ;DL = 0                                   I2
           TEST      AL,DL           ;CHECK STATUS BYTE FOR ANY ERRORS?
           JZ        TSTSTS6         ;NO ERROR IF STS BYTE IS 0
           CMP       M[IOSTS],0      ;IS IO ERROR?                             I1
           JZ        TSTSTS4         ;NO THEN CONTINUE WITH NEXT CHECK
           MOV       DL,LEDIO        ;DL = IO TEST #
           OR        DL,DH           ;ADD SLOT # THAT FAILED
           JMP       TSTSTS6
TSTSTS4:   CMP       M[LPBKSTS],0    ;CHECK IF COMM LOOPBACK ERROR
           JZ        TSTSTS5         ;NO THEN PROCEED WITH NEXT CHECK
           MOV       DL,LEDCOMM      ;DL = COMM LOOPBACK TEST #
           JMP       TSTSTS6
TSTSTS5:   MOV       DL,LEDRAM       ;DL = RAM TEST #
TSTSTS6:   MOV       M[LEDPTRN],DL   ;SAVE LED PATTERN IN THE CONTROL AREA     I2
           NOT       DL              ;COMPLEMENT TO LIGHT UP LED'S
           MOV       AL,DL           ;AL = LED PATTERN
           OUT       LEDPORTA,AL     ;DISPLAY PATTERN ON LED'S

END OF THIS ROUTINE
           -------------------
           RET                       ;RETURN
```

*Fig. 37.*

```
                          ----------------------------
                          SELF TEST SUPPORT ROUTINES
                          ----------------------------

WAIT ROUTINE
                          ------------
                          WAIT PERIOD = AH MSEC

WAIT    EQU     $                                                          ⎤
                                                                                    |
                 XOR     AL,AL           ;AL = 0                            USED IN  |
         WAITLP: DEC     AL              ;DECREMENT LOOP                    D3,D6,   ⎬
                 NOP                                                        G4-2     |
                 JNZ     WAITLP          ;LOOP 256 TIMES ( 1 MSEC)                   |
                 DEC     AH                                                          |
                 JNZ     WAITLP          ;WAIT FOR ABOUT AH MSEC                     |
                 RET                     ;RETURN                                     ⎦

ASSIGN SPURIOUS IV TO ALL 64 INT LEVELS
                         ---------------------------------------
         IVSPUR: PUSH    ES                                                          ⎤
                                                                                    |
                 XOR     SI,SI           ;SI = 0                                     |
                 MOV     CX,X'40'        ;CX = # OF IL'S                    USED IN  |
                 LES     BX,SPURIV       ;ES,BX = ABS PTR TO SPURIOUS INT HANDLER    ⎬ D1,G4-1
         IVSPURLP EQU    $                                                           |
                 MOV     M[SI],ES        ;ENTER HIGH ADR WORD OF IV                  |
                 MOV     M[SI+2],BX      ;ENTER LOW ADR WORD OF IV                   |
                 ADD     SI,4            ;POINT INDEX TO NEXT IV                     |
                 LOOP    IVSPURLP        ;ASSIGN ALL 64 INT LEVELS                   ⎦

POP     ES
                 RET                     ;RETURN

INTERRUPT HANDLERS
                         ------------------

EXPECTED INTERRUPT HANDLER
                         --------------------------
         EXPIV   EQU     $                                                          ⎤
                 INC     M[INTRCV]       ;INCREMENT INT RECV FLAG           USED IN  ⎬ G4-2
                 EI                                                                  |
                 RET                     ;RETURN FROM INTERRUPT                     ⎦

SPURIOUS INTERRUPT HANDLER
                         --------------------------
         SPURIV  EQU     $                                                          ⎤
                 MOV     M[INTSPUR],1    ;SET SPURIOUS INT FLAG             USED IN  ⎬ G4-2
                 EI                                                                  |
                 RET                     ;RETURN                                    ⎦

RTC INTERRUPT HANDLER
                         ---------------------
         RTCIV   EQU     $                                                          ⎤
                 INC     M[INTRCV]       ;INC INT RECV FLAG                 USED IN  |
                 OUT     CLRRTC,AL       ;CLEAR RTC INTERRUPT               D4,D7,   ⎬
                 EI                                                         D10      |
                 RET                     ;RETURN                                    ⎦

----------------
                         END OF SELF TEST
                         ----------------
         CODESG  ENDS                    ;END OF CODE SEGMENT
                 END
```

DATA PROCESSING SYSTEM WITH SELF TESTING AND CONFIGURATION MAPPING CAPABILITY

BACKGROUND OF THE INVENTION

This invention pertains to data processing systems and, more particularly, to a data processing system having a program-controlled self testing capability and incorporating means for generating a system configuration map each time the self test program is exercised.

It is increasingly common in the data processing industry to employ networks of processing units coupled together by communication links. The overall processing capability of the system is distributed among the individual units of the system. This development has been made possible by the advent of large scale integration circuit fabrication techniques, which have led to the ready availability of small, relatively inexpensive microprocessor circuit modules which may be conveniently employed at many different locations within the system.

In such distributed data processing systems, it becomes increasingly important, as the complexity and processing power of each of the individual units is increased, to provide means and methods for automatically verifying the operational functionality of the units. Furthermore, as each unit is designed to provide more flexible operations and therefore is configurable to operate in a variety of different modes, means and methods must be provided to indicate the particular configuration and status of each unit to the other units in the system and to provide for updating the configuration and status information each time a unit is placed in a different operating mode.

OBJECTS AND SUMMARY OF THE INVENTION

It is therefore an object of the present invention to provide an improved data processing system and improved operating methods therefor.

A further object is to provide an improved data processing system and methods for operating such system wherein an individual processing unit within a distributed processing network has an automatic, pre-programmed self testing capability.

Still a further object is to provide a system of the type described wherein the self testing capability is coupled with means and methods for indicating the operating status and configuration of the unit.

Still a further object is to provide a system of the type described wherein the status and configuration information generated for an individual unit is automatically updated at periodic intervals.

To achieve the foregoing objects and in accordance with a first aspect of the invention, a data processing system having processing means and memory means is provided with means for implementing the steps of operating a first test program to determine the functionality of a first section of the memory means, inhibiting further operation of the system if the first memory section is determined to function erroneously, operating a second test program to determine the functionality of a second section of the memory means, and storing in the first memory section the results obtained during the operation of the second test program.

In accordance with an another aspect of the invention, a data processing system having processor means, random access memory (RAM) means and read only memory (ROM) means is provided with means for implementing the steps of sequentially reading stored data out of the storage locations in the ROM memory means, calculating a signature word based on the contents of the data read out from the ROM memory means, and storing the signature word in a predetermined location in the RAM memory means.

In accordance with a further aspect of the invention, a data processing system having processor means, memory means and a plurality of I/O controller means is provided having apparatus for implementing the steps of issuing an interrupt request signal to a selected one of the I/O controller means to test such means, receiving an interrupt response signal from the selected I/O controller means and comparing the signal against a predetermined interrupt response value, generating an interrupt status word, including an error flag bit, in response to the result of the comparison operation performed in the last-mentioned step, and storing the interrupt status word in a predetermined storage location of the memory means.

The accompanying drawing which are incorporated in and constitute a part of the specification, illustrate a preferred embodiment of the invention and together with the description, serve to explain the principles of the invention.

BRIEF DESCRIPTION OF THE DRAWINGS

In the drawings:

FIGS. 3a and 3b, placed side-by-side with FIG. 3a on the left, represent a schematic block diagram of the circuits within the MPC of FIG. 2.

FIGS. 4-15 are flowchart diagrams illustrating the microprogram firmware resident in the MPC for controlling the self test and configuration status functions of the system.

FIGS. 16-38 provide a microinstruction listing for the firmware shown in the flowchart diagrams of FIGS. 4-15.

DETAILED DESCRIPTION OF EMBODIMENT

Figure 1:
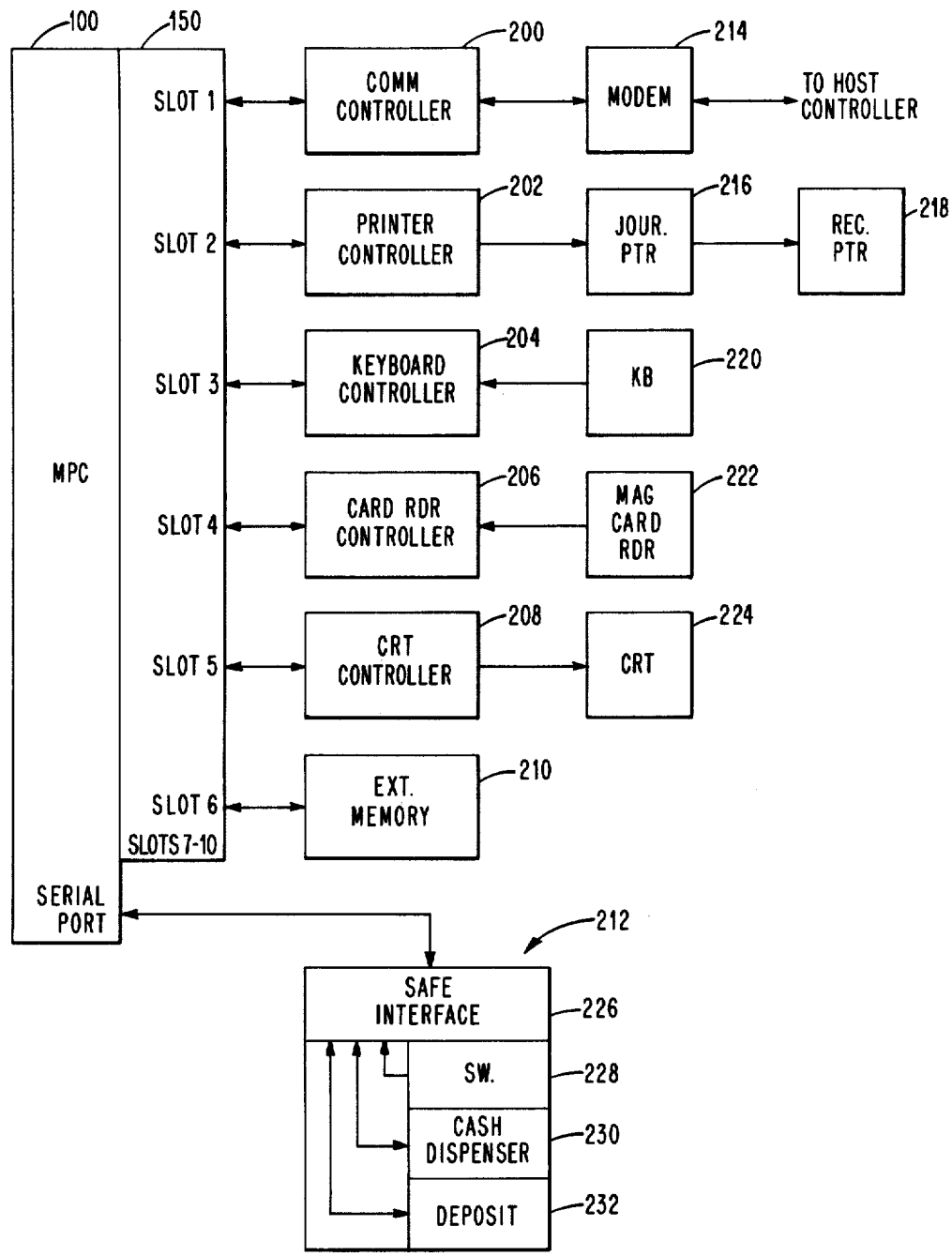
FIG. 1 is a schematic block diagram illustrating the present invention in a system for controlling an automatic bank teller terminal.

FIG. 1 illustrates the present invention in the form of a system for controlling an automatic bank teller terminal. The system includes a microprocessor controller (MPC) 100 which is coupled via an interface connector 150 to a plurality of input/output (I/O) controllers 200, 202, 204, 206, 208, an external memory module 210, and a safe unit 212. The latter includes a safe interface circuit 226, function switches 228, a cash dispenser unit 230, and a depository unit 232. The general organization and function of an exemplary system of this type, as well as the details of one type of safe unit 212 and cash dispenser and depository apparatus operable therewith, are described in copending U.S. applications entitled "Automatic Cash Depository", Ser. No. 092,525, by Ronald D. Guibord, Robert G. Yetman and Richard G. Harris, filed Nov. 8, 1979; "Automatic Note Dispenser With Purge Control", Ser. No. 103,655, by Ronald D. Guibord, Neil W. Harman and Richard E. Hennessy, filed Dec. 14, 1979; and "Purge Control For Automatic Note Dispenser", Ser. No. 103,688, by Ronald D. Guibord, Neil W. Harman and Richard E. Hennessy, filed Dec. 14, 1979.

The system of FIG. 1 can be interfaced to any intelligent transaction controller via a communications link including modem 214, which is coupled to communication controller 200. Printer controller 202 interfaces the MPC to a journal printer 216 and a receipt printer 218 which operate to provide two forms of hardcopy output for the system.

Keyboard controller 204 interfaces the MPC to a remote keyboard unit 220 which may be located, for example, on the customer control panel provided with the teller terminal. A card reader controller 206 functions as an interface for a magnetic card reader 222 adapted, for example, to read the magnetically encoded data from a customer identification card inserted into the control panel. Controller 208 interfaces the MPC to a cathode ray tube (CRT) display unit 224 also provided on the customer control panel to provide visual instruction data to guide the customer in executing a transaction. An external memory module 210 is coupled to the MPC to provide a storage facility for the operating system firmware, as well as to provide additional general purpose data storage capacity. The safe unit 212 is coupled to the MPC via the serial communication port of the MPC and enables communication between the microprocessor and the safe unit via interface circuit 226 in accordance with a bit-serial communication link protocol.

Figure 2:
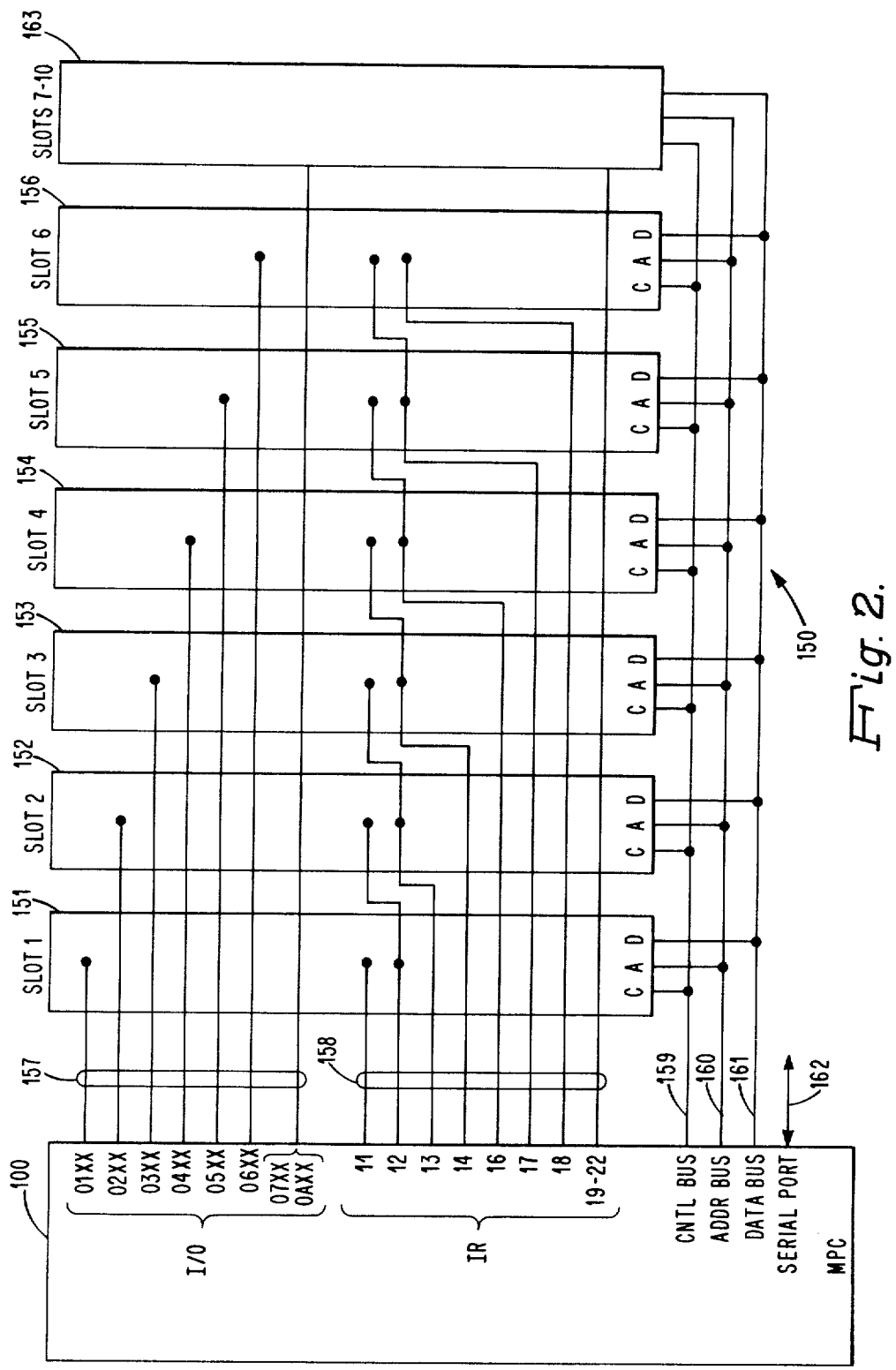
FIG. 2 is a schematic block diagram illustrating further details of the microprocessor controller (MPC) and interface connector of the system shown in FIG. 1.

FIG. 2 illustrates the MPC inputs and outputs as well as the interface connector 150 in greater detail. The connector employed in the illustrated embodiment includes ten circuit board connection slots. The first six slots, 151, 152, 153, 154, 155, and 156 are utilized to accommodate the five controllers 200, 202, 204, 206, 208, and the external memory unit 210, respectively. Slots 7-10 are provided for system expansion and are not utilized in the present embodiment. As shown in FIG. 2, an input/output controller (IOC) device selection bus 157 is provided to connect the MPC 100 with the ten slot connectors. Each of the ten lines 01XX-0AXX (designated in accordance with hexidecimal notation) is connected to a specified contact terminal in each of the ten interface slots. When the MPC performs an I/O operation, one of the ten lines within bus 157 is enabled to activate the particular I/O device selected. The I/O devices inserted in the interface slots have their top ten terminals connected in common such that the device will be enabled by an IOC selection signal no matter what slot the device is inserted in.

An IOC interrupt bus 158 also connects the interface slots 1-10 to the MPC 100. Eleven interrupt lines designated IR11-IR14 and IR16-IR22 are included within the bus to enable each of the I/O devices to send one or two interrupt level response signals to the MPC. The interrupt response lines are connected to the same pair of contact terminals within each of the interface slots in the cascading fashion illustrated in FIG. 2. This permits the proper allocation of interrupt lines to the different I/O devices while still permitting the flexibility of inserting, with a minimum of restrictions, any I/O device into any interface slot. The restriction imposed by the illustrated interface arrangement is that if any I/O device requires two interrupt levels, the device inserted in the next higher number slot must require zero interrupt levels. With the ten slot arrangement illustrated, this restriction limits the system to the use of no more than five two-interrupt devices (inserted in slots 1, 3, 5, 7, and 9, or 2, 4, 6, 8, and 10). Of course, interface connector 150 will accommodate up to ten single interrupt devices. As will be described hereinafter, the self test firmware employed with the system provides an interrupt contention check to make sure that the above-described interrupt restrictions are properly observed.

The connection between the MPC and the interface connector 150 further includes an 8-line control bus 159, a 20-line address bus 160, and an 8-line data bus 161. The 36 lines included within these three buses are connected in parallel to the same 36 contact terminals within each of the connector slots. A single line 162 is connected to the MPC serial communication port and, as indicated in FIG. 1, is dedicated to the safe unit 212.

FIGS. 3a and 3b provide a circuit schematic showing the individual circuit components employed within MPC 100. For ease of understanding, FIGS. 3a and 3b should be viewed together with FIG. 3a on the left. The MPC includes a microprocessor 102 which may be, for example, a conventional model 8088 microprocessor manufactured by the Intel Corporation.

Microprocessor 102 includes an 8-line multiplexed input/output bus 103 for transmitting eight address signals AD0-AD7 and for receiving and transmitting 8-bit parallel data bytes to and from a transceiver circuit 108. The latter is coupled to an 8-line internal data bus 105 which is in turn connected to IOC transceiver 142. Data bus 105 allows the transfer of data between the microprocessor 102 and the interrupt controller 124 and memory modules 130, 132, 136, and 138 provided within the MPC as well as between the microprocessor and the I/O devices. Data is transferred to and from the I/O devices coupled to interface connector 150 via the internal data bus 105, transceiver 142, and the IOC data bus 161. Data is transferred to and from the microprocessor and the safe unit 212 via internal data bus 105, serial communication port 128, and the single line serial port bus 162.

An 8-bit address latch circuit 106 is also connected to the multiplex bus 103 and is used to latch the AD0-AD7 outputs from the microprocessor and hold them for providing address signals to the remainder of the system. A control signal ALE is provided as a strobe to latch the signals on bus 103 and to feed them, along with the twelve address outputs MA8-MA19 from the microprocessor, to an address buffer circuit 114 via the 20-line address bus 113. The twenty outputs from buffer 114 are provided as address signals MA0-MA19 on the 20-line address bus 111, which feeds the various memory and control circuits of the MPC as well as the I/O devices coupled to the interface connector 150. The address signals are fed to the I/O devices via address buffer 144 and the IOC address bus 160.

Microprocessor 102 also issues control signals S0-S2 via the 3-line output bus 164. Control signals S0-S2, along with a clock signal generated by oscillator 104, are decoded by decode circuit 116 to provide nine control signals on the 9-line control bus 115. A first of these control signals is the advanced memory write command AMWC which is transferred via buffer circuit 120 and IOC control bus 159 to the external memory module 210 where it is employed to strobe data write operations therein. Memory read command signal MRDC is employed within the MPC to strobe memory read operations in the RAM modules 130 and 132 and in the PROM modules 136-138. MRDC is also transferred via buffer 120 and the IOC control bus 159 to the I/O devices to control memory read operations therein. The address latch enable signal ALE is utilized only within the MPC and, as previously mentioned, strobes the address latch 106 to develop the address signals MA0–MA7.

The data enable signal DEN provided on control bus 115 is applied to the IOC data transceiver 142 to condition it for data transfer operations. DEN is also coupled via buffer 120 and the IOC control bus 159 to the I/O devices. A data transmit/receive control signal DT/$\overline{\text{R}}$ is fed internally within the MPC to the transceiver 142 and operates to properly condition the bus driver circuits thereof to perform transmit or receive operations. DT/$\overline{\text{R}}$ is also coupled to the I/O devices via IOC control bus 159.

An input/output read command IROC is provided on control bus 115 and applied internally within the MPC to the interrupt controller 124, serial Com Port 128, and the diagnostic PROM 110 to provide a read enable signals to these circuits during input/output operations. IROC is also transmitted to the I/O devices via control bus 159. An input/output write command IOWC is also generated for application to the interrupt controller 124, serial Com Port 128, and diagnostic PROM 110 to enable write operations on the input/output ports of the circuits. IOWC is likewise transmitted via the IOC control bus 159.

An advanced input/output write command signal AIOWC is generated and employed on the IOC control bus to set up selected registers in the I/O devices prior to the generation of IOWC. An interrupt acknowledge signal INTA, also provided on control bus 115, is applied to the interrupt controller 124 as well as to the I/O devices to acknowledge the receipt of interrupt signals initiated by these devices.

Oscillator 104 feeds the clock signal CLK to the microprocessor 102 for the usual timing and control purposes and in addition provides an input to decode circuit 116 to enable the generation of the nine control signals just described. In addition, oscillator 104 feeds the clock signal to real time clock generator circuit 118 which in turn generates an interrupt signal IR8. IR8 is fed to interrupt controller 124 to provide internal interrupt capability within the MPC.

The MPC is provided with a RAM chip 130 including 256 bytes of random access memory. In addition, the MPC has 1KB of additional random access memory in a second RAM chip 132. A diagnostic programmable read only memory (PROM) chip 110 is also provided within the MPC to store the self test and configuration mapping control firmware, which is described hereinafter in detail. RAMs 130 and 132 and PROM 110 are controlled by a memory chip select circuit 134 which receives the eight address signals MA8–MA15 from address bus 111 and provides an enabling output to RAM 130, RAM 132, or PROM 110, depending on the area of memory being accessed by MA8–MA15. RAM chip 130 is addressed by address signals MA0–MA6 which are applied from address bus 111 to the address inputs A of the RAM chip. RAM 132 is addressed by MA0–MA9. The diagnostic PROM 110 is addressed via the multiplex bus 103 by AD0–AD7 applied directly from microprocessor 102. As previously mentioned, read commands MRDC are applied to RAMs 130 and 132 and the read command IORC is applied to the PROM 110. Data read from RAMs 130 and 132 is coupled via the internal data bus 105 and transceiver 108 to the microprocessor, while data read from PROM 110 is transmitted to the microprocessor via multiplex bus 103.

The MPC also includes eight 2KB PROM modules 136–138, which are used to store the executive firmware employed by the system. PROMs 136–138 are enabled by the outputs supplied by a PROM chip select circuit 140. The latter is enabled by IO/$\overline{\text{MEM}}$ fed to its gating input G and is further controlled by address inputs MA11–MA13 supplied by address bus 111. The output of chip select circuit 140 selects one of the eight PROMs. Each PROM is supplied at its address input A with address signals MA0–MA10 to select a particular byte location therein. The MRDC read command is also supplied to the PROMs 136–138 as a read strobe signal.

An MPC device select decoder 122 is provided to generate enabling inputs to the diagnostic PROM 110, interrupt controller 124, and serial Com Port 128. Decoder 122 decodes the MA4–MA7 address inputs from address bus 111 and is gated by an output from I/O device select decoder 126. The latter decodes the MA8–MA11 address signals and is gated by IO/$\overline{\text{MEM}}$ which is supplied from the microprocessor control bus 164. The sixteen outputs from decoder 126 represent the gating input to decoder 122 and the fifteen IOC select bus signals I/O 01XX–I/O AXX.

Serial Com Port 128 is a programmable communication chip circuit which receives input address data via the MA0–MA2 address signals and an enable signal from MPC device select decoder 122. The serial Com Port 128 receives 8-bit parallel data bytes from the internal data bus 105 and transmits them in bit-serial fashion to the safe unit 212 via the serial port data bus 162. Conversely, Com Port circuit 128 receives bit-serial data on line 162 and transmits it in 8-bit parallel byte form to internal data bus 105. The circuit 128 utilizes the read and write control signals IORC and IOWC and generates the interrupt signals IR9 and IR10 which are transmit and receive interrupts, respectively.

Interrupt controller 124 is enabled by the MA0 signal from address bus 111 and responds to interrupt signals IR8–IR22 received from the real time clock generator 118, serial Com Port 128, and the I/O devices via IOC interrupt bus 158 to generate the interrupt signal INTR to microprocessor 102. The microprocessor in turn generates the interrupt acknowledge signal INTA to interrupt controller 124 and to the I/O devices to signal that the microprocessor is ready to process the interrupt. Thereafter, interrupt controller 124 transmits an interrupt vector to the microprocessor via internal data bus 105. The IR vector is a 32 bit word which is stored within the interrupt controller and tells the processor what memory location in the RAM circuits stores the instructions for servicing the particular interrupt.

Address signals MA0–MA7 are utilized to provide operating instructions to the I/O devices when the latter are enabled by the IOC select signals I/O 01XX–I/O 0AXX. Thus, each of the I/O devices connected to interface connector 150 has the capability of decoding MA0–MA7 to provide up to 256 control functions.

Diagnostic PROM 110 stores the diagnostic firmware resident within the MPC for performing the self test and configuration mapping operations provided by the present invention. The system hardware is arranged to cause the microprocessor 102 to issue the hexidecimal address FFFF0 during the power-up cycle when the system is initially turned on. When FFFF0 is applied to the address bus 111 and a memory read command is issued, the first instruction from the firmware resident in diagnostic PROM 110 is fed to the microprocessor and the system commences the self test routine. The latter may also be called by non-resident diagnostic software provided from the host controller via com controller 200. The purpose of the self test routine is to provide a go/no-go test for the system. Additionally, the routine creates a system configuration map. The pass/fail status of the system, after being exercised by the self test routine, appears visually on an LED display 112 which is driven through the diagnostic PROM 110. There are nine LEDs within display 112 that are stepped to indicate the particular self test subroutine being exercised and are extinguished only after the entire routine has been completed successfully. In case of failure, a particular failure code is displayed by the LEDs to alert the operator to the cause of the failure.

The self test routine operates with maximum reliability since it is contained in a dedicated diagnostic PROM which is coupled directly to the microprocessor 102 via the multiplex bus 103. This bus architecture ensures the execution of the self test microprogram as long as at least the microprocessor and the diagnostic PROM are functional. The self test strategy for failure detection operates such that any failure within the MPC or the availability of less than 16 K of random access memory within external memory module 210 is considered to be a catastrophic failure and terminates system operation with the point of failure being encoded on the LED display 112. In such a case the self test firmware hangs up in a loop which continues to repeat the failing test. If the program detects non-catatrophic failures, appropriate error flags are set and status indicators generated and entered into a configuration table in MPC ROM 132 and the system continues in operation.

The self test routine performs the following operations in order:
1. Microprocessor Test
2. Random Access Memory Test
3. Real Time Clock Test
4. MPC Loop-Back Communications Test
5. ROM Signature Calculation
6. Controller I/O Test
7. System Configuration Creation FIGS. 4–15 illustrate the self test microprogram in flowchart diagram form. FIGS. 16–38 disclose the microprogram instructions encoded in Intel 8088 source code, which is well known to those skilled in the art. As previously indicated, microprocessor 102 may be an Intel 8088 microprocessor chip and accordingly is capable of executing the microprogram illustrated in connection with FIGS. 4–38.

OPERATION

Figure 4:
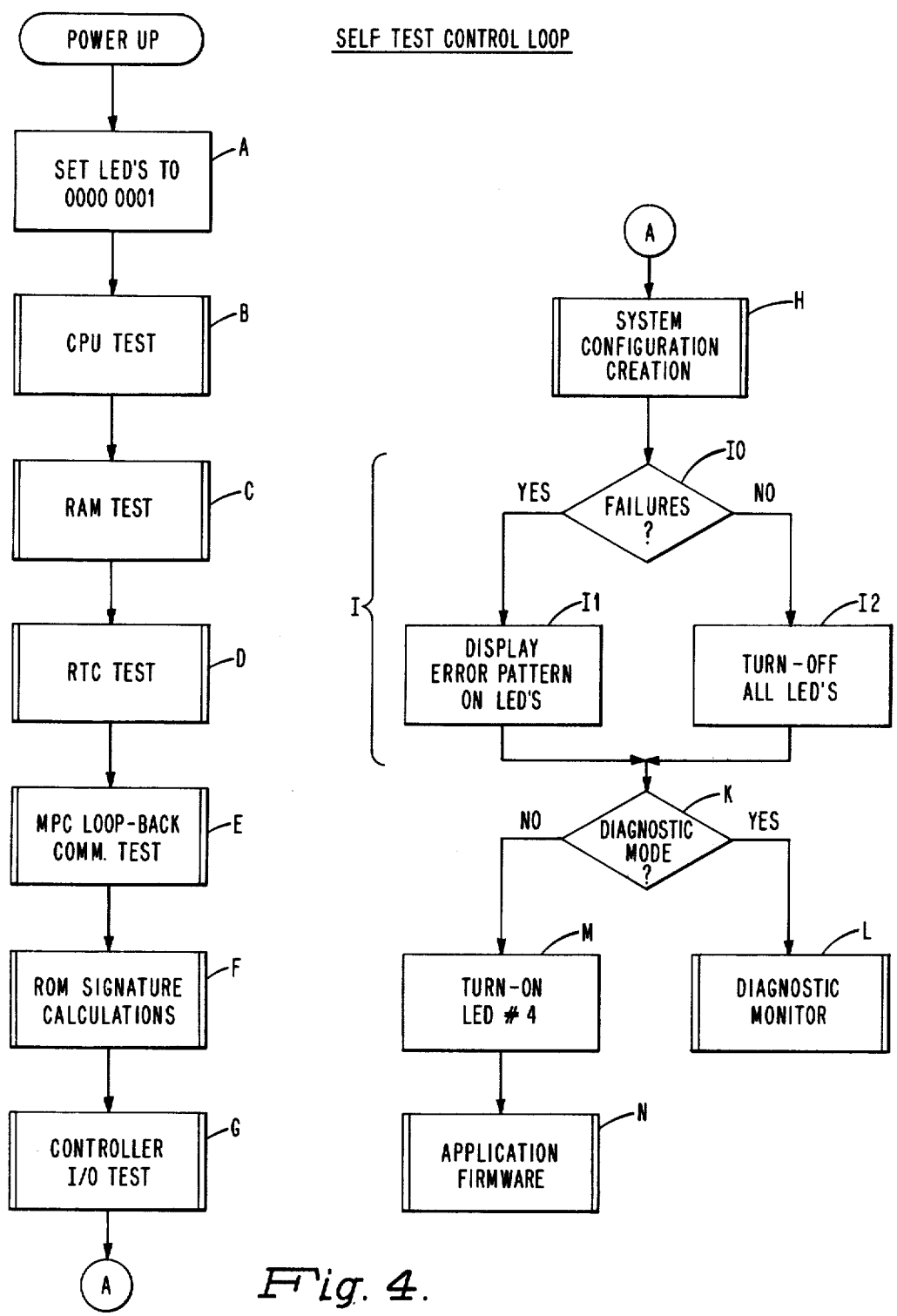

FIG. 4 shows the basic self test control loop which, as previously described, is initiated during the system power up cycle and proceeds through a number of self test subroutines. In the process of execution it compiles configuration tables which provide system status and configuration information for use by the operating sytem and by remote units in the processing network which must from time to time interface with the MPC and its various I/O devices. As shown in FIG. 4, the first step A in the self test control loops set LED display 112 to indicate 0000 0001, which tells the operator that the system is executing the initial test of the routine, the CPU test. The control loop then sequentially cycles through the various testing subroutines B, C, D, E, F, G, and H.

After creating the system configuration tables in step H, the system executes step I wherein the LED display is either set to provide the appropriate error indication, if failures occurred, or is turned off to signal the pass condition. Thereafter, branching step K is executed to determine whether the system is to continue in the diagnostic mode, in which case the Y branch is employed to exit to a diagnostic monitor subroutine L. If the system is to proceed to its regular operation, step K is exited via the N branch, LED No. 4 is turned on in step M and the system exits to the operational firmware in step N to initiate normal operations.

The microprogram instructions included in the self test control loop of FIG. 4 are shown in detail beginning with the legend "Self Test Begins Here" in FIG. 18 and continuing to the legend "End Of Self Test Control Loop" shown in FIG. 19. The control loop begins with a series of seven initialization instructions beginning with the instruction ORG OF800H and ending with the instruction MOV SP,STACKH. The subsequent instructions within the control loop are designated by the letters A–N in FIGS. 18 and 19, corresponding to the similar designations employed in FIG. 4. The information provided in FIGS. 16, 17, and the top of FIG. 18 provide the necessary definitions for understanding the program. The actual instructions appear in columns two and three of the listing. As indicated in FIG. 18, the first instruction in step A is MOV AL,LEDCPU. This loads register AL with a data word representing the CPU test pattern "LEDCPU". As shown in FIG. 16, "LEDCPU" equals 01 (0000 0001 in binary notation). On completion of step A, the program executes JMP CPUTST, which is the initial instruction of the CPU test subroutine and directs the program to jump to the location of that subroutine.

CPU Test

Figure 5:
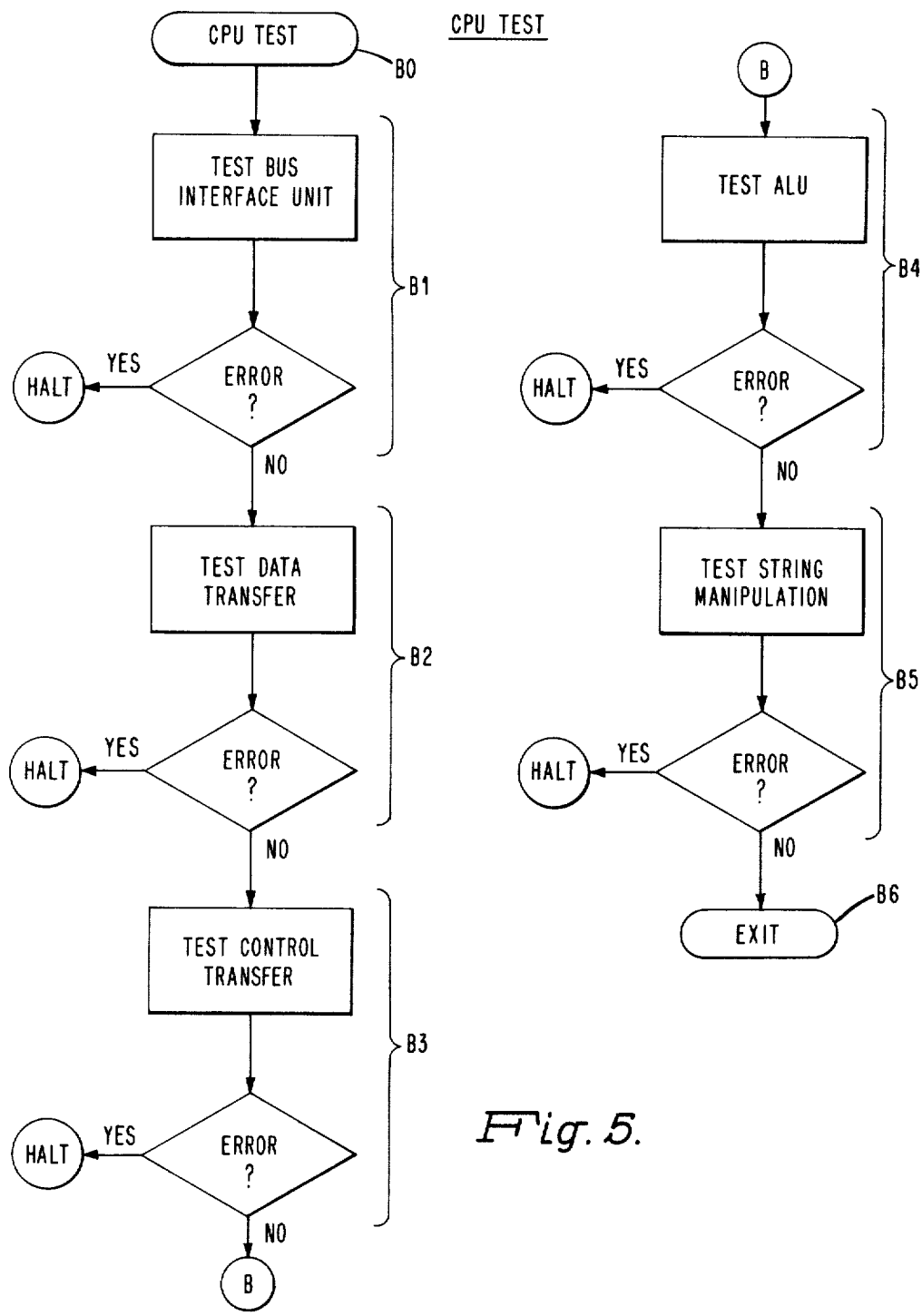

The CPU test subroutine B is illustrated in the flowchart diagram of FIG. 5 and described in detail by the microprogram instructions listed in FIGS. 19-22 are designated B0–B6. The latter designations correspond to the similar designations B0–B6 applied to the flowchart diagram of FIG. 5. Instruction group B1 tests the system data buses by transmitting patterns of alternating 1's and 0's over the buses and verifying the received data to determine if an error condition exists. If no errors are detected, the routine advances to the instruction group B2 to test the various addressing and data transfer modes of the microprocessor. Next, instruction group B3 is executed to test the control transfer capability of the microprocessor first through verification of conditional control transfer operations and then through verification of iteration control transfer operations.

Next, the arithmetic and logic unit of the microprocessor is tested through execution of instructions B4. As shown at the top of FIG. 21 instructions are executed for testing the increment, decrement, rotate right, rotate left, not, and addition operations. The final operations executed in the CPU test subroutine are performed through the execution of instructions B5 which test the ability of the microprocessor to perform certain data string scanning and searching operations. Upon successful completion of the microprocessor tests, the program executes instruction B6 JMP SELFLP2 which is a jump to instruction SELFLP2 in the self test control loop. As shown in FIG. 18, SELFLP2 is the initial instruction of the random access memory test subroutine C. Since this instruction is JMP MEMTST calling for a jump to MEMTST, the program jumps to instruction C0 shown in FIG. 22 to initiate the RAM TEST subroutine. If an error was detected during the CPU tests, the program does a jump to CPUERR which in turn jumps to CPUHLT in the control loop (FIG. 18), which flags the detection of the CPU error.

Random Access Memory Test

Figure 6:
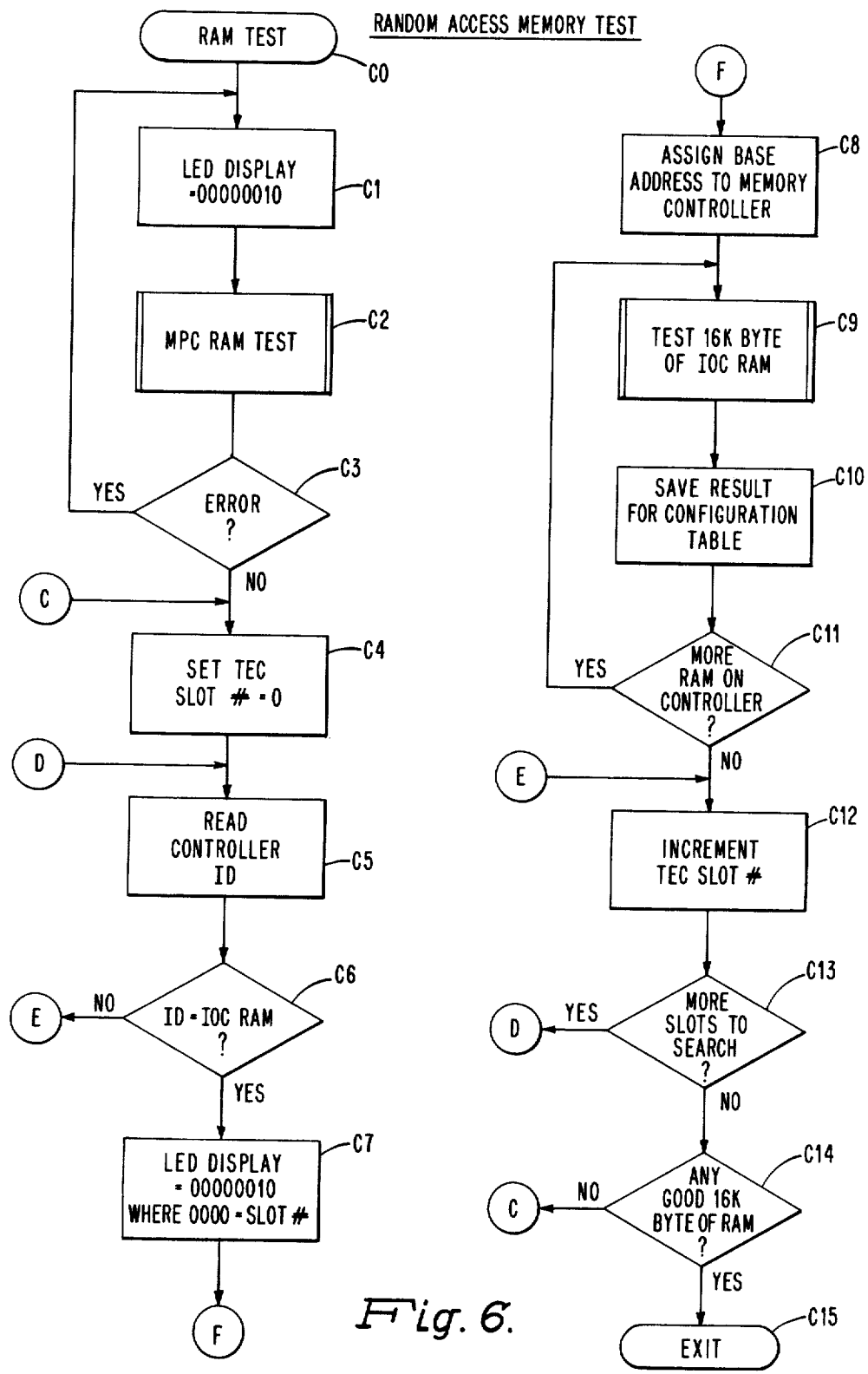

The RAM TEST subroutine, illustrated in FIG. 6, includes the instruction groups C0-C15 which are described in detail in FIGS. 22-26. In this subroutine, the functionality of the MPC static RAM 132 is first tested and if successful operation is verified, the circuits within external memory module 210 are checked. Referring to FIG. 6, after the LED display is set to indicate 0000 0010 in step C1, the MPC RAM TEST subroutine C2 is entered to check the operation of the MPC RAM 132. The subroutine C2 includes the four operations C2-0 through C2-3 shown in FIG. 7. The microprogram instructions which implement these procedures are shown at the top of FIG. 25. Operation C2-2 is the further subroutine RAMTST which is illustrated in the flow diagram of FIG. 7a and includes the steps C2-2-0 through C2-2-8. These latter instructions are in turn described in detail in FIG. 26.

The procedure used to verify the functionality of the MPC RAM is contained in the RAMTST subroutine of FIG. 7a. After the parameters have been properly initialized in step C2-2-1, the program writes, in each location of the RAM, test data determined by subtracting the least significant bit from the most significant bit of the address of the test location. Thereafter, this data is verified in a read operation in step C2-2-3 and if any error is detected, a logical exclusive OR operation is performed between the expected data and the detected data. Any failed RAM bits are thus indicated by the logic state 1 and an accumulative failure statistic is obtained by logically ORing the individual occurrences detected during the test run. The error detection and accumulation function is performed in step C2-2-4. Thereafter, the same sequence of tests is repeated with the test data complemented. This is done in steps C2-2-5 through C2-2-7.

If any errors are detected during the C2 subroutine, it is considered to be a catastrophic failure and when the program advances to step C3 (FIG. 6) it loops back to step C1 and the MPC RAM TEST procedure is repeated. This loop reiterates so long as an error is detected and the self test program hangs up with the LED display set at 0000 0010.

Assuming that the MPC RAM checks out satisfactorily, the program advances to step C4 to initiate testing of the external RAM memory. This is done in the TEST 16KB of IOC RAM subroutine C9, which is shown in further detail in FIG. 8 and which, as noted, includes RAMTST subroutine C9-2. The instructions included in the subroutine C9-2 are shown in the middle of FIG. 25. It is noted that instruction C9-2 is JMP RAMTST, which is a jump to the RAMTST subroutine shown in FIG. 26 and FIG. 7a, which is the same subroutine previously used to test the MPC RAM. Thus, the (MSB-LSB) test pattern is verified for each address twice, first in a direct and then in a complemented mode. This is done for each 16K of external RAM. After each 16K RAM block is checked, the results are recorded in step C10 (FIG. 6) for use in the configuration table.

The specific instructions included in step C10 are given in FIG. 23. The program enters a 4 byte word into the table (located in MPC RAM 132) for each 16K byte of external RAM. The first two bytes contain an address pointing to the beginning of the 16K byte block, the third byte records the IOC interface (slot) number of the associated memory controller, and the fourth byte records the results of the RAM test. This latter byte is 0 if no failures were detected, otherwise it contains the accumulated failure bits detected for the 16K memory block. Appropriate table pointer and size data is then entered in the self test control section of the MPC RAM 132. This is done for each 16K block of external memory tested.

After each external RAM block within a given interface slot is tested, as described above, the program advances to steps C12 and C13 (FIG. 6) and searches for additional interface slots that contain external memory to be checked. The same procedures are repeated for each memory controller located. After all external memory has been checked, the program executes branch instruction C14 to determine if any 16K block of external memory was found to be good. If no good block flag is found to be set (instruction group C14—FIG. 24) the program reverts to step C4 and repeats the entire IOC RAM test cycle again. This loop reiterates so long as no good 16KB block of IOC RAM is located. This condition is therefore a catastrophic failure condition which hangs up the self test program in a pattern generation mode with the appropriate error indication being displayed on the LEDs. If at least one good 16K block of RAM was found, the program exits step C14 through the Y branch and advances to step C15, which as shown in FIG. 24 is a jump to SELFLP3. This returns the program to the control loop (FIG. 18), whereupon the instruction CALL RTCTST is executed to initiate the real time clock test subroutine D.

Real Time Clock Test

Figure 9:
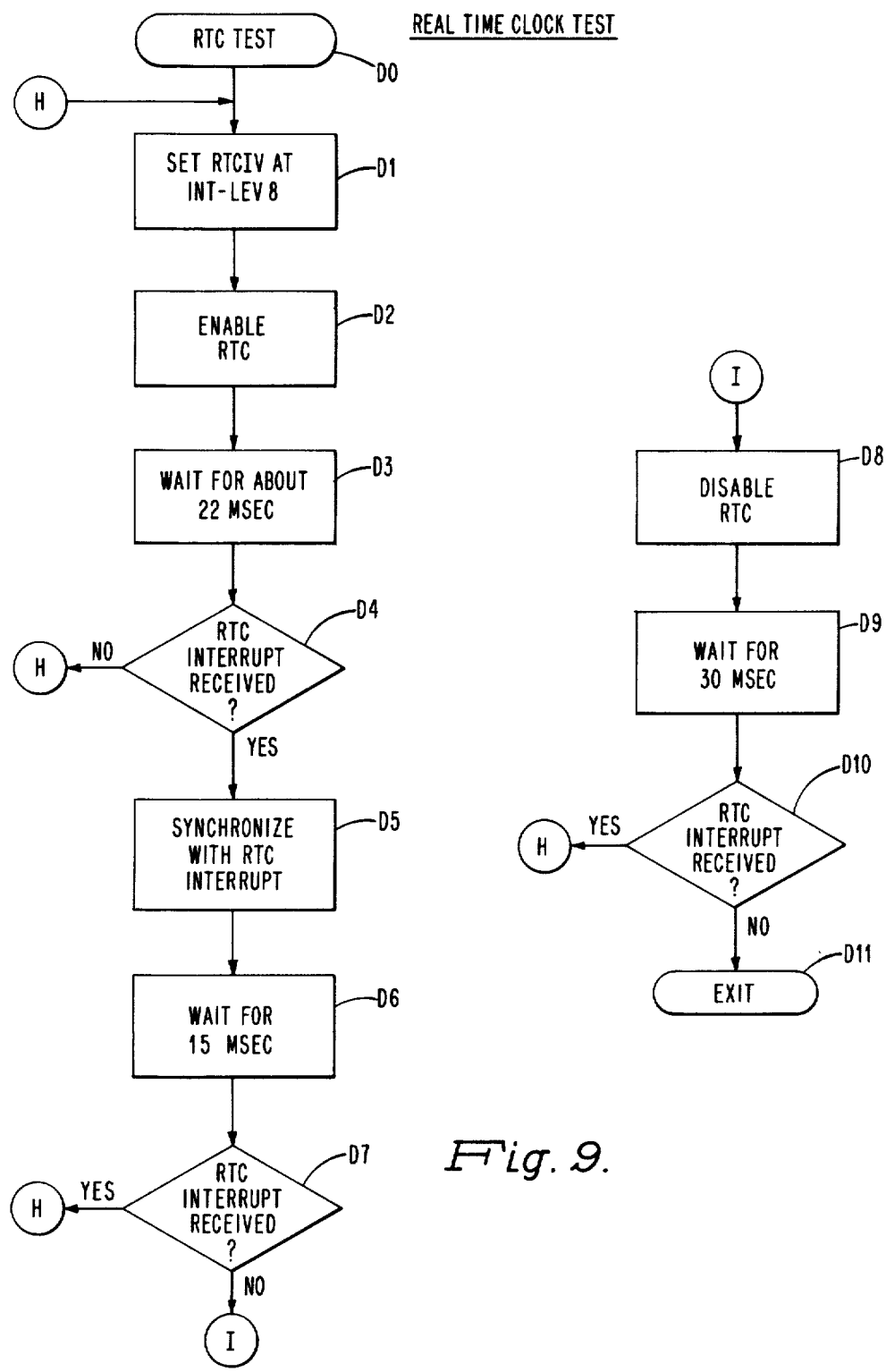

The Real Time Clock Test subroutine D is shown in FIGS. 9 and 27. (the IOC RAM TEST description given on page 2-4 of the functional specification should be inspected for description that can be added to the above part of the specification).

The real time clock test determines if the real time clock resident within the MPC is operational. The real time clock generator 118 (FIG. 3a) is designed to interrupt the microprocessor 60 times a second (approximately every 17 msec.). RTC test instructions D1-D4 test to see whether the interrupt function is operable. Instructions D5-D7 test for the occurrence of premature interrupts while instructions D8-D10 test to make sure that no interrupt can occur when the real time clock is disabled. Failure of the real time clock in any of the three modes tested represents a catastrophic failure condition and thus if the program exits step D4 via the N branch or if it exits either of branching steps D7 or D10 via the Y branch it returns to step D1 and repeats the real time clock test. The program thus hangs up in this loop so long as any error is detected and further operation of the system is effectively inhibited with an appropriate error display being presented on the LEDs.

If the real time clock test is executed successfully, the program exits via the N branch of step D10 and enters exit step D11 which, as indicated in FIG. 27, is a return (RET) instruction. This causes the program to revert to the self test control loop (FIG. 18), which is entered at SELFLP4 for execution of the instruction CALL LPBKTST. This call instruction initiates the MPC Loop-Back Communication Test subroutine E.

Loop-Back Communication Test

The MPC Loop-Back Communication Test subroutine E is described in detail in the flowchart diagram of FIG. 10 and the instruction listing of FIGS. 28 and 29. This test is designed to verify the capability of the Com Controller 200 which may be, for example, a Signetics model 2651 programmable communications interface module.

The MPC communications test subroutine E operates to put the Com Controller in a local loop-back mode wherein the transmitter and receiver are tied together. By transmitting and receiving predetermined bit patterns and checking the results, the program ascertains whether or not the controller is operating properly. As shown in FIG. 10, the first step of the subroutine, E1, changes the LED display to indicate 0000 0100, signalling that the loop-back communications test is running.

In steps E2 and E3 the Com Controller is configured for local loop-back operation with the interrupts disabled. In steps E4 and E5 a logical 1 data pattern is transmitted with rotation of the 1 bit to all bit positions. Thereafter a complementary data pattern is transmitted with the logical 0 being rotated to all bit positions. The data patterns received are verified for accuracy and any failed data bits detected are accumulated in memory. Since an error in this test is not considered to be catastrophic, detected errors are flagged and saved and the system is allowed to continue the testing functions.

On completion of the loop-back communication test, the program executes exit instruction E7 (FIG. 28) which is a return to the basic control loop (FIG. 18). This executes CALL SIGNTRE, which is the initial instruction of the ROM Signature Calculations subroutine F.

ROM Signature Calculations

The ROM Signature Calculations subroutine is described in detail in connection with the flowchart diagram of FIG. 11 and the instruction listing of FIGS. 30-32. The signature calculation subroutine is provided as a means for verifying the MPC PROMs, which store the system executive firmware. The calculation subroutine calculates a signature for each 1K byte within the PROMs. The signature is calculated in the form of an eight digit binary coded decimal (BCD) word which should have the same value as was determined from the paper tape data used in burning the PROM. A signature value of 76160070 results for any non-existent 1K byte within the PROMs. No error conditions are generated in connection with the ROM signature calculation subroutine since the system as described herein does not perform a comparison of the calculated signature with the known signature value.

In the first step F1 of the subroutine, the LED display is set to indicate 0000 0101 to signal that the signature calculation subroutine is running. Thereafter, in step F2 the processor is set to address the beginning of the initial 1K byte in the PROM. In step F3 a signature word is generated by reading out the contents of the PROM and accumulating the data bits therein in accordance with a prescribed signature calculation procedure. The procedure is described at the top of FIG. 31 and is implemented by first setting the signature value to 00000000 (BCD). Thereafter, the signature value is multiplied by 2 and a first data byte is read out of the PROM and added to the total. If this operation results in a carry being generated out of the most significant digit of the total, then a BCD 1 is added. This value then becomes the signature value and the steps B through D are repeated to continue the calculation operation.

When 1024 bytes have been read from the PROM and thus accumulated, the program advances to step F4 where the calculated signature word is saved in the configuration table. As indicated in FIG. 30, this procedure is performed by entering the 2 byte offset address of the PROM into the signature save area and then the 4 byte signature word (eight BCD digits) is entered. Thereafter the signature pointer value is moved to the signature table area.

Next, in step F5 the PROM address pointer is incremented by 1K to prepare for generation of the next signature word. When signatures have been calculated for each 1K block of PROM memory, the program advances to exit step F7 and executes a return to the self test control loop (FIG. 18) and initiates subroutine G by executing call instruction CALL IOTST.

Controller I/O Test

The Controller I/O Test is described in the flowchart diagrams of FIGS. 12-14 and by the program instruction listing shown in FIGS. 33, 34, 35, and the top of FIG. 36. The controller I/O test determines the controller self test status and then verifies the interrupt response of the controller. As shown in FIG. 12, the IOC interface slot number is set to 0 in step G1 and thereafter the LED display is set in step G2 to indicate the slot number and the number 0110, which indicates that the controller I/O test is being run.

Next, the controller self test status subroutine G3 is executed. This subroutine is shown in the flowchart diagram of FIG. 13 and in the instruction listing of FIG. 34. In step G3-1, the program reads the identification number of the first controller and saves it in the configuration table along with the I/O slot number. In step G3-2 it ascertains whether the controller has a self test capability. If the answer to this is yes then a self test command is issued and the system waits for the controller to finish the test. If errors are detected during the controller self test operation, they are indicated by appropriate flags.

Thereafter, in step G3-3 the controller status is saved in the save area of memory for the configuration table. Two bytes of controller status configuration data are entered in the save area adjacent the previously entered IOC slot number byte and the controller ID byte. Thereafter, the program advances to step G3-4 and executes a return instruction which initiates step G4 (FIG. 12) by calling the Interrupt Response and Contention Test subroutine.

The Interrupt Response and Contention Test subroutine is shown in the flowchart diagram of FIG. 14 and in the instruction listing disclosed in FIG. 35 and the top of FIG. 36. This tests verifies the interrupt response for each controller and determines whether there is any interrupt contention between adjacent controllers. Interrupt contention results when a controller requiring an interrupt level is configured in an interface slot following a controller requiring two interrupt levels. Detection of an interrupt contention results in the program turning on LED 12 to signal the interrupt contention condition. The program (FIG. 14) first assigns an interrupt vector in step G4-1 and then issues an interrupt request to the selected controller slot in G4-2. In step G4-3 the designated interrupt level is checked to see if a response was received as expected and if no response or an erroneous response occurs, the program branches out of G4-3 via the N branch to step G4-6, where an appropriate error flag is set.

If the expected interrupt response is detected, the program exits G4-3 via the Y branch to step G4-4 and checks whether the numbers of interrupts received equals 0. If yes, the program branches directly to step G4-7 where the interrupt response status is saved in the configuration table. If the number of interrupts received is not equal to 0, the program takes the N branch out of step G4-4 and proceeds to step G4-5, where it determines whether the controller in the preceeding interface slot required two interrupts. If the response to this is no, the program branches to G4-7 to compile the interrupt response status for the configuration table. If the answer determined in step G4-5 is yes, the program advances to step G4-6 and sets an appropriate error flag.

In step G4-7 the program enters a single interrupt status byte into the configuration table location for the controller being tested. The interrupt status byte is an 8-bit byte wherein bits 0-5 indicate the interrupt level value, bit 6 indicates whether the interrupt test was passed or failed and bit 7 indicates the number of interrupt levels for the controller.

After completing the interrupt response and contention test for the selected controller, the program advances to step G5 (FIG. 12) and increments the interface slot number. When all interface slots have been tested as described above, the program advances to step G7 where LED 12 is turned on if an interrupt test error had been detected. Thereafter, the program advances to exit step G8 which, as shown in FIG. 33, is a return instruction. This returns the program to the control loop (FIG. 18) whereupon the instruction CALL SYSCNFG is executed to initiate the System Configuration Creation subroutine H.

System Configuration Creation

The System Configuration Creation subroutine H is described in the flowchart diagram of FIG. 15 and in the instruction listing shown in the middle of FIG. 36. The initial step H1 sets the LED display to indicate 0000 0111, signalling that the system configuration creation subroutine is being run. Thereafter, as shown in FIG. 36, the three instructions H2, H3, and H4 are executed. Each of these instructions is a call instruction followed by a return instruction. The final return, instruction H5, causes the program to exit the subroutine and return to the self test control loop to execute the instruction CALL TSTSTS to initiate the subroutine I. The latter includes steps I0, I1, and I2 shown in FIG. 4 and described in connection with the program listing of FIG. 37.

In step I0, the program determines whether any test failures were detected during the self test routine. If no failures were detected, the program exits via the N branch and executes step I2 to turn off the LEDs of display 112. If any failures were detected, the program executes step I1 to display the appropriate error pattern on the LEDs. As previously described, nine LEDs are used. LEDs 1-4 display an indication of the self test subroutine which detected the failure condition. The subroutines are indicated on LEDs 1-4 in accordance with the following table:

0001—CPU Test
0010—RAM Test
0011—Real Time Clock Test
0100—Loop-Back Communication Test
0101—ROM Signature Calculation
0110—Controller I/O Test
0111—System Configuration Map
1000—Firmware Initialization In Progress LEDs 5-8 display the controller slot number for which the error was detected. A display of 0000 by LEDs 5-8 indicates that the error was detected in the MPC during an MPC test. LED 12 provides an indication of an interrupt contention error.

Thereafter, the program exits from the self test routine via steps K, L, M, and N. In step K, the program determines whether diagnostic operation is to be continued and if the answer is yes, it exits to diagnostic monitor subroutine L. If normal system operation is to be initiated, the program exits through the N branch of step K, turns on LED 4 in step M, and proceeds to execute the application firmware subroutine N.

It is noted that FIG. 38 describes a variety of control subroutines used in the program steps noted on the right of the listing.

It is thus seen that each time the system is powered up, the self test routine is executed to verify the functionality of the system and to create a configuration map providing current system configuration and status data. This data is available for access by the operating system and application software to determine where the different I/O controllers exist and what their current status is. The external control systems thus can determine how to assign their own interrupt vectors, levels, physical I/O, and device handlers to enable their own accessing of the controllers and to alter their procedures in the event that parts of the system are indicated to be non-functional.

It will be apparent to those skilled in the art that various modification and variations could be made to the embodiment of the invention as hereinabove described without departing from the spirit and scope of the invention.

What is claimed is:

1. A logic test and configuration map control system in a data processing system including processor means and memory means comprising, in combination:
   first test means responsive to said processor means for determining the functionality of a first section of said memory means;
   inhibit means responsive to said first test means for issuing a control signal to said processor means to inhibit further operation of said logic test and configuration map control system if said first memory section is determined to function erroneously;
   second test means in electrical communication with said first test means and said inhibit means for determining the functionality of a second section of said memory; and
   means in electrical communication with said second test means for storing in a predetermined location of said first memory section the results of the operation of said second test means indicating the functionality of said second memory section.

2. The logic test and configuration map control system set forth in claim 1 further comprising:
   control means for enabling said microprocessor to initiate said first test means each time said data processing system is powered up.

3. A logic test and configuration map control system in a data processing system including processor means, RAM memory means, and ROM memory means comprising, in combination:
  reader means responsive to said processor means for reading stored data out of the storage locations in said ROM memory means;
  signature means in electrical communication with said reader means for calculating a signature word based on the contents of said stored data; and
  means for storing said signature word in a predetermined location in said RAM memory means to form a system configuration map indicative of the operating status and location of said ROM memory means.

4. The system set forth in claim 3 wherein said logic test and configuration map control system comprises:
  means included in said reader means for reading said stored data out of said ROM memory means a byte at a time;
  means included in said signature means for forming an accumulated total of said bytes read out of said ROM memory means;
  multiplication means for multiplying said accumulated total of said data bytes by a first constant before each new data byte is added thereto; and
  adding means for adding a second constant to said accumulated total each time a carry is generated out of the highest order digit position of said accumulated total by the addition of said new data byte, thereby producing said signature word.

5. The system set forth in claim 4 wherein said multiplication means is constructed and arranged to multiply by a first constant of 2.

6. The system set forth in claim 5 wherein said adding means is constructed and arranged to add a second constant of 1.

7. The system set forth in claim 6 wherein said signature means, said multiplication means, and said adding means are constructed and arranged to calculate said signature word in decimal notation represented by binary coded decimal digits.

8. The system set forth in claim 7 further comprising:
  control means for enabling said logic test and configuration map control system each time said data processing system is powered up.

9. A logic test and configuration map control system in a data processing system including processor means, memory means, and a plurality of I/O controller means comprising, in combination:
  means responsive to said processor means for issuing an interrupt request signal to a selected one of said I/O controller means;
  first test means for receiving an interrupt response signal from said selected I/O controller means and for comparing said signal against a predetermined interrupt response value;
  second test means for generating an interrupt status word, including an error flag bit, in response to the result of the comparison performed by said first test means; and
  data transfer means for storing said interrupt status word generated by said second test means in a predetermined storage location of said memory means.

10. The logic test and configuration map control system set forth in claim 9 wherein said selected I/O controller means includes means for generating a plurality of interrupt response signals at different interrupt levels, and said logic test and configuration map control system further comprises:
  third test means for totaling and thereafter recording the number of interrupt response signals received from said selected I/O controller means; and
  fourth test means for comparing the number of response signals recorded by said third test means with the number of response signals previously recorded for a different I/O controller and for generating an error signal if said previously recorded number is 2 and said number recorded for said selected I/O controller means is greater than zero.

11. The system set forth in claim 9 wherein each said I/O controller means includes means for generating an identification number indication, said system further comprising:
  means for reading the identification number indication for said selected I/O controller means; and
  means cooperating with said second test means for including a representation of said identification number in said interrupt status word.

12. The system set forth in claim 11 further comprising:
  means for sequentially selecting each of said I/O controller means, whereby an interrupt status word is generated for each said controller means; and
  means included in said data transfer means for storing each said interrupt status word in a different storage location in said memory means.

13. The system set forth in claim 12 further comprising:
  control means responsive to a system power up signal for enabling said means for issuing an interrupt request signal, said first test means, said second test means, said storage means, said means for sequentially selecting each of said I/O Controller means, said means for reading the identification number indication and said means for including a representation of said identification number each time said system is powered up.

14. A method for operating a logic test and configuration map control system in a data processing system having processing means and memory means, comprising the steps of:
  operating a first test program to determine the functionality of a first section of said memory means;
  inhibiting further operation of said system if said first memory section is determined to function erroneously;
  operating a second test program to determine the functionality of a second section of said memory means; and
  storing in said first memory section the results obtained during the operation of said second test program.

15. A method for operating a logic test and configuration map control system in a data processing system having processor means, RAM memory means, and ROM memory means comprising the steps of:
  sequentially reading stored data out of the storage locations in said ROM memory means;
  calculating a signature word based on the contents of said data read out form said ROM memory means; and
  storing said signature word in a predetermined location in said RAM memory means.

16. A method for operating a logic test and configuration map control system in a data processing system including processor means, memory means, and a plurality of I/O controller means comprising the steps of:

issuing an interrupt request signal to a selected one of said I/O controller means to test said controller means;

receiving an interrupt response signal from said selected I/O controller means and comparing said signal against a predetermined interrupt response value;

generating an interrupt status word, including an error flag bit, in response to the result of the comparison operation performed in said last-mentioned step; and storing said interrupt status word in a predetermined storage location of said memory means.

17. A logic self-test and configuration map control system in a data processing system having a processing control means, a system memory means, and plural input/output (I/O) controller means, which comprises:

(a) self-test memory means in said processor control means for storing firmware instructions to be executed in testing the operability of said processing control means, said system memory means and said plural I/O controller means, and in forming a system configuration table indicative of the operating status and location of each system device tested;

(b) map memory means in said processing control means and in electrical communication with said self-test memory means and accessible by system devices external to said processing control means for storing said system configuration table;

(c) microprocessor means in said processing control means and in electrical communication with said self-test memory means and said map memory means for executing said firmware instructions to issue control signals to test said processing control means, said map memory means, said system memory means, and said plural I/O controller means, and to sense responses to said control signals in forming said system configuration table in said map memory means; and (d) start-up control means in said processing control means and in electrical communication with said microprocessor means for automatically initiating the execution of said firmware instruction by said microprocessor means upon the initiation of a system power-up cycle.

* * * * *